United States Patent
Harashima

(10) Patent No.: US 9,918,385 B2
(45) Date of Patent: Mar. 13, 2018

(54) ELECTRONIC DEVICE

(71) Applicant: TOSHIBA MEMORY CORPORATION, Minato-ku (JP)

(72) Inventor: Shiro Harashima, Sagamihara (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/450,131

(22) Filed: Mar. 6, 2017

(65) Prior Publication Data

US 2017/0347454 A1   Nov. 30, 2017

Related U.S. Application Data

(60) Provisional application No. 62/343,434, filed on May 31, 2016.

(51) Int. Cl.
| H01R 24/00 | (2011.01) |
| H05K 1/18 | (2006.01) |
| H01R 24/64 | (2011.01) |

(52) U.S. Cl.
CPC ............. *H05K 1/18* (2013.01); *H01R 24/64* (2013.01); *H05K 2201/10159* (2013.01)

(58) Field of Classification Search
CPC . H01R 24/64; H05K 1/18; H05K 2201/10159
USPC .......................................... 439/676, 660, 83
See application file for complete search history.

(56) References Cited

U.S. PATENT DOCUMENTS

| 6,945,465 B2 * | 9/2005 | Nishizawa ....... G06K 19/07732 235/492 |
| 7,422,488 B1 * | 9/2008 | Wu ..................... H01R 13/6597 439/676 |
| 7,787,615 B2 * | 8/2010 | Hammond, Jr. ..... H05K 1/0228 379/417 |
| 7,909,656 B1 * | 3/2011 | Erickson ............ H01R 13/6463 439/676 |
| 8,047,879 B2 * | 11/2011 | Hashim .............. H01R 13/6658 439/404 |
| 8,202,128 B2 * | 6/2012 | Hammond, Jr. ..... H05K 1/0228 439/676 |
| 8,267,728 B2 * | 9/2012 | Nakaie ............... H01R 13/6467 439/676 |
| 8,480,435 B2 * | 7/2013 | Hsiao ................. H01R 13/6658 439/660 |
| 8,500,463 B2 * | 8/2013 | Tsai .................... H01R 13/6658 439/78 |

(Continued)

FOREIGN PATENT DOCUMENTS

| JP | 5015826 | 8/2012 |
| JP | 3180092 U | 12/2012 |

*Primary Examiner* — Abdullah Riyami
*Assistant Examiner* — Vladimir Imas
(74) *Attorney, Agent, or Firm* — Oblon, McClelland, Maier & Neustadt, L.L.P.

(57) ABSTRACT

According to an embodiment, an electronic device includes a substrate, first conductors, second conductors, a connector, third conductors, an electronic component, and a first wiring. The first conductor is complied with a first USB standard. The second conductor is complied with a second USB standard. The connector is mounted on the first conductors or the second conductors. The first wiring connects one of the first conductors, one of the second conductors, and one of the third conductors.

20 Claims, 13 Drawing Sheets

(56) References Cited

U.S. PATENT DOCUMENTS

| | | | | |
|---|---|---|---|---|
| 8,535,068 B2* | 9/2013 | Tsai | ............... | H01R 24/62 |
| | | | | 439/83 |
| 8,610,000 B2* | 12/2013 | Champion | ........... | H05K 1/0245 |
| | | | | 174/262 |
| 8,641,456 B2* | 2/2014 | Wu | ............... | H01R 24/30 |
| | | | | 439/676 |
| 8,670,243 B2* | 3/2014 | Mitsuhashi | ............ | H05K 1/117 |
| | | | | 361/679.32 |
| 8,678,673 B2* | 3/2014 | Lin | ............... | G06K 19/07732 |
| | | | | 385/14 |
| 8,678,841 B2 | 3/2014 | Wang et al. | | |
| 8,784,123 B1* | 7/2014 | Leiba | ............... | H01R 27/00 |
| | | | | 439/218 |
| 8,961,206 B1 | 2/2015 | Chen et al. | | |
| 8,998,620 B2* | 4/2015 | Ni | ............... | H01R 12/71 |
| | | | | 361/737 |
| 9,490,584 B2* | 11/2016 | Little | ............... | H01R 13/6581 |
| 9,762,009 B2* | 9/2017 | Little | ............... | H01R 24/60 |
| 2013/0090019 A1 | 4/2013 | Su et al. | | |
| 2014/0024257 A1* | 1/2014 | Castillo | ............... | H01R 13/6585 |
| | | | | 439/607.05 |
| 2015/0162684 A1* | 6/2015 | Amini | ............... | H01R 12/73 |
| | | | | 439/660 |
| 2015/0171561 A1* | 6/2015 | Little | ............... | H01R 24/60 |
| | | | | 439/607.34 |
| 2015/0171562 A1* | 6/2015 | Gao | ............... | H01R 13/6582 |
| | | | | 439/345 |

* cited by examiner

ELECTRONIC DEVICE

CROSS-REFERENCE TO RELATED APPLICATIONS

This application is based upon and claims the benefit of priority from U.S. Provisional Application No. 62/343,434, filed on May 31, 2016; the entire contents of which are incorporated herein by reference.

FIELD

Embodiments herein relate generally to an electronic device.

BACKGROUND

An electronic device may incorporate a connector.

DETAILED DESCRIPTION

In general, according to one embodiment, an electronic device includes: a substrate; first conductors complied with a first USB standard on the substrate; second conductors complied with a second USB standard on the substrate; a connector connectable to an external connector, the connector mounted on the first conductors or the second conductors; third conductors on the substrate; an electronic component electrically connected to the third conductors; and a first wiring on the substrate, the first wiring connecting one of the first conductors, one of the second conductors, and one of the third conductors.

An electronic device according to embodiments will be described below in detail with reference to the accompanying drawings. Note that these embodiments should not be considered to limit the scope of the present invention.

First Embodiment

A first embodiment will be described below with reference to FIGS. 1 to 8. Note that elements or description of the elements according to embodiments may be expressed differently. Such elements and descriptions are not intended for limiting other expressions not recited herein. Moreover, for elements and descriptions given no different expressions, any other expressions may be provided.

Figure 1:
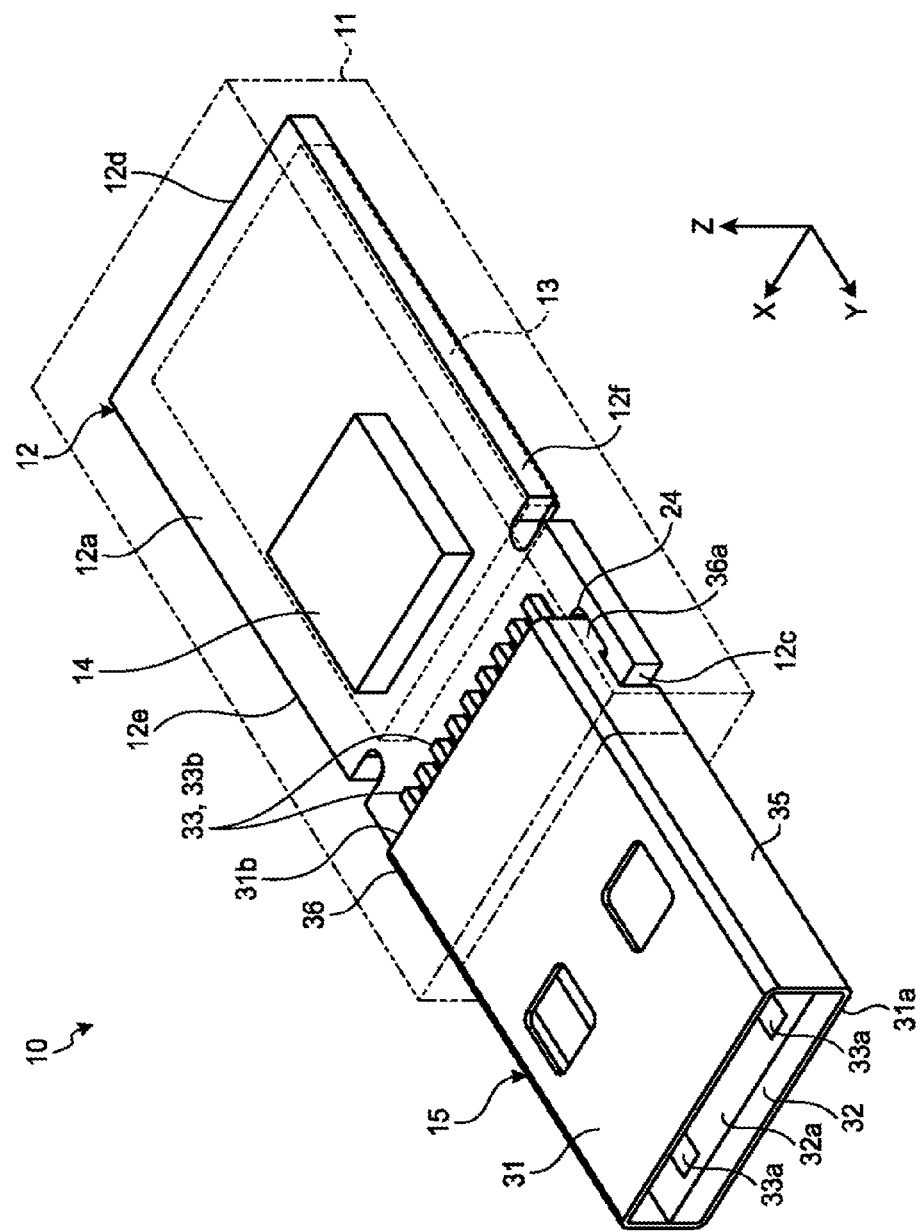
FIG. 1 is a perspective view of a USB drive according to a first embodiment.

FIG. 1 is a perspective view of a USB flash drive (hereinafter referred to as USB drive) 10 according to the first embodiment. The USB drive 10 is an example of electronic device, and may also be referred to as, for example, semiconductor memory device, semiconductor device, memory device, auxiliary memory device, removable medium, or device. An electronic device may be, for example, portable computer, tablet, television receiver, display, smartphone, mobile phone, IC recorder, consumer electronics, auxiliary memory device such as hard disc drive (HDD) or solid state drive (SSD), cable or adapter for connecting devices, or another electronic device.

As illustrated in FIG. 1, the USB drive 10 according to the present embodiment has a substantially cuboid shape, for example. The USB drive 10 may have other shapes. As illustrated in each drawing, in this specification, X axis, Y axis, and Z axis are defined. The X axis, the Y axis, and the Z axis are orthogonal to one another. The X axis extends along the width of the USB drive 10. The Y axis extends along the length of the USB drive 10. The Z axis extends along the thickness of the USB drive 10.

In the present embodiment, the USB drive 10 includes a housing 11, a substrate 12, a flash memory 13, a controller 14, and a first plug 15. The flash memory 13 may also be referred to as, for example, non-volatile memory, memory, memory unit, or electronic component. The controller 14 is an example of electronic component, and may also be referred to as, for example, control unit. The first plug 15 is an example of first connector, and may also be referred to as, for example, inserter or connector.

In FIG. 1, the housing 11 is represented by the two-dot chain line. The housing 11 houses the substrate 12, the flash memory 13, the controller 14 and a part of the first plug 15. The housing 11 may have a cover for accommodating the first plug 15, for example. The housing 11 is made of, for example, synthetic resin or metal.

The substrate 12 is, for example, a printed circuit board (PCB). The substrate 12 may be another substrate such as flexible printed circuit board (FPC). The substrate 12 has a substantially square (rectangle) plate shape. The substrate 12 may have another shape.

Figure 2:
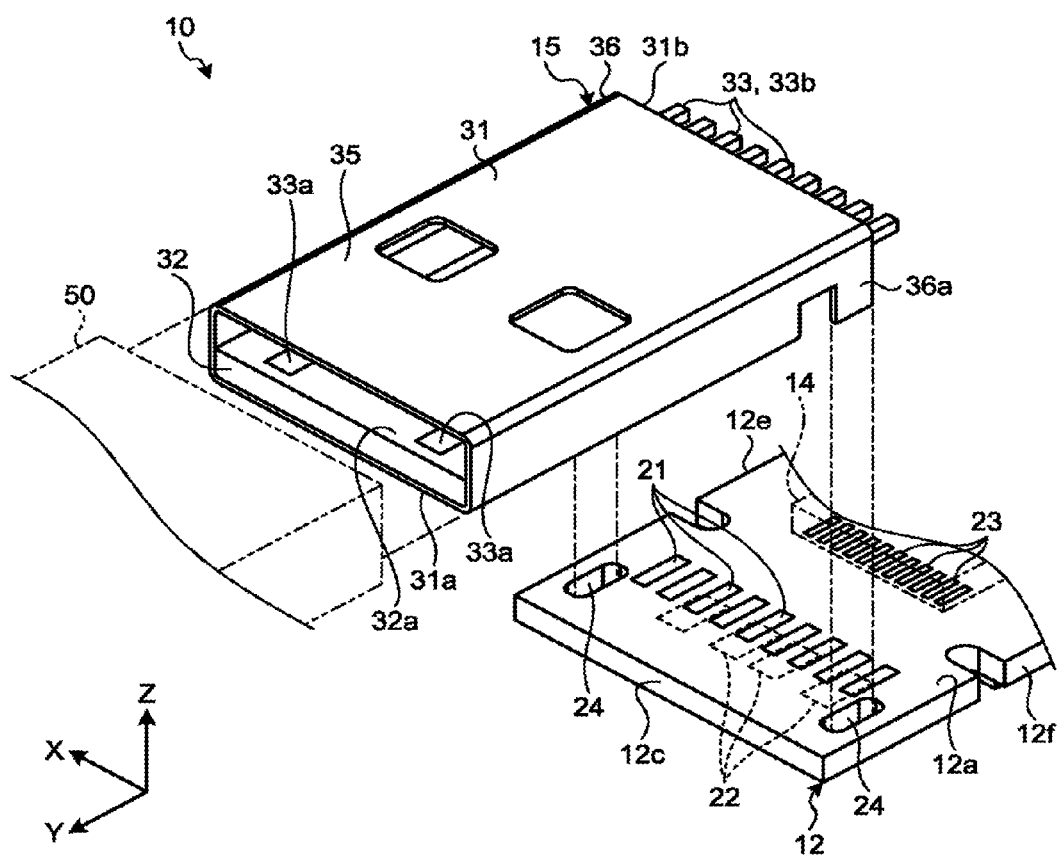
FIG. 2 is a perspective view of a part of the USB drive according to the first embodiment.
Figure 3:
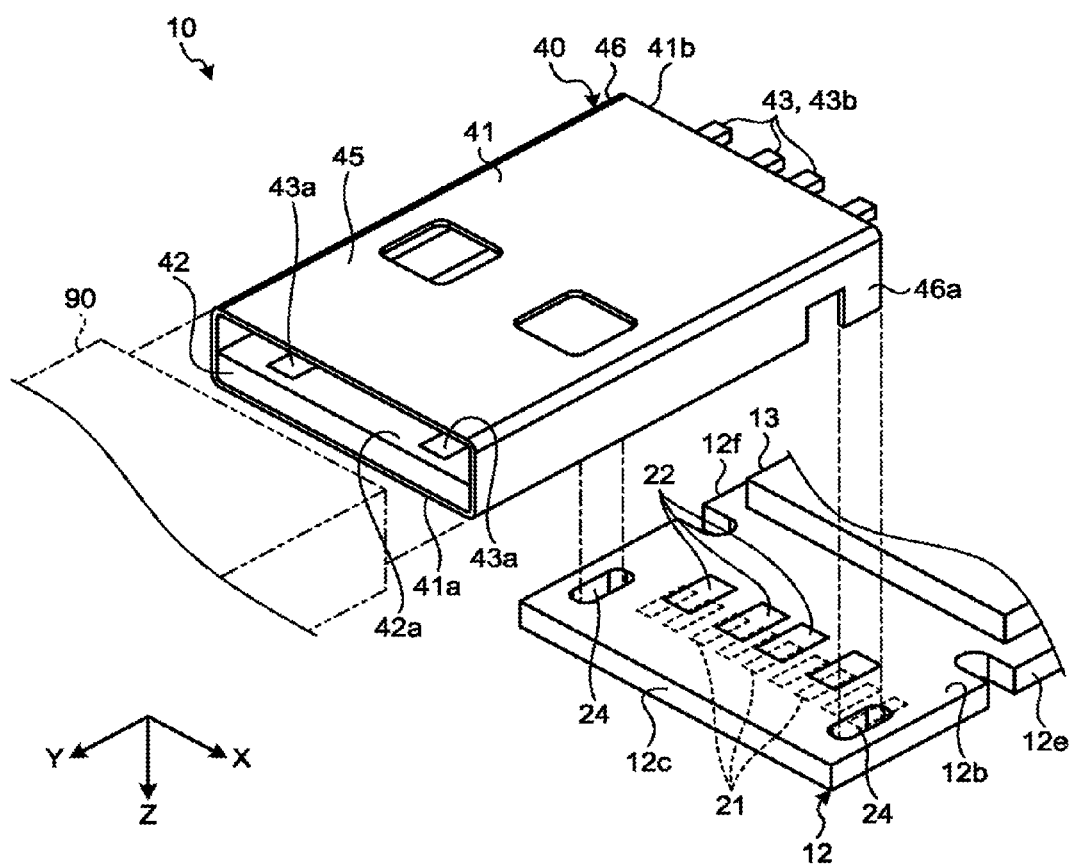
FIG. 3 is a perspective view of a part of the USB drive according to the first embodiment seen oppositely from FIG. 2.

FIG. 2 is a perspective view of a part of the USB drive 10 according to the first embodiment. FIG. 3 is a perspective view of a part of the USB drive 10 according to the first embodiment when seen oppositely from FIG. 2. In FIG. 2, the controller 14 is represented by the two-dot chain line. As illustrated in FIGS. 1 to 3, the substrate 12 has a first face 12a, a second face 12b, a front end 12c, a rear end 12d, a first side end 12e, and a second side end 12f. The front end 12c is an example of second short side. The rear end 12d is an example of first short side. The first side end 12e is an example of first long side. The second side end 12f is an example of second long side.

Each of the front end 12c, the rear end 12d, the first side end 12e, and the second side end 12f may also be referred to as edge. The front end 12c, the rear end 12d, the first side end 12e, and the second side end 12f are named for the sake of explanation alone, and are not intended to limit the positions and the directions of the front end 12c, the rear end 12d, the first side end 12e, and the second side end 12f.

The first face 12a is a substantially flat face that faces in a positive direction along the Z axis (direction indicated by the Z-axis arrow). The second face 12b is located opposite to the first face 12a. The second face 12b is a substantially flat face that faces in a negative direction along the Z axis (opposite to the direction indicated by the Z-axis arrow).

The front end 12c, the rear end 12d, the first side end 12e, and the second side end 12f connect the ends of the first face 12a and the ends of the second face 12b. The front end 12c is an end face of the substrate 12 in the positive direction along the Y axis (direction indicated by the Y-axis arrow), and extends in the X axis direction.

The rear end 12d is an end face of the substrate 12 in the negative direction along the Y axis (opposite to the direction indicated by the Y-axis arrow). The rear end 12d is apart from the front end 12c in the negative direction along the Y axis and extends in the X axis direction.

The first side end 12e is an end face of the substrate 12 in the positive direction along the X axis (direction indicated by the X-axis arrow) and extends in the Y axis direction. The second side end 12f is an end face of the substrate 12 in the negative direction along the X axis (opposite to the direction indicated by the X-axis arrow). The second side end 12f is apart from the first side end 12e in the negative direction along the X axis and extends in the Y axis direction.

The substrate 12 has a substantially rectangular shape, extending in the Y axis direction when the first face 12a is seen from above. The distance between the front end 12c and the rear end 12d in the Y axis direction is longer than the distance between the first side end 12e and the second side end 12f in the X axis direction.

Each of the front end 12c and the rear end 12d forms the short side of the substrate 12. Each of the first side end 12e and the second side end 12f forms the long side of the substrate 12. The Y axis direction may also be referred to as the long side direction of the substrate 12. The X axis direction may also be referred to as the short side direction of the substrate 12.

As illustrated in FIG. 2, first pads 21, second pads 22, third pads 23, and two holes 24 are provided on the substrate 12. The first pads 21 are an example of first conductor. The second pads 22 are an example of second conductor. The third pads 23 are an example of third conductor. The first pads 21, the second pads 22, and the third pads 23 may also be referred to as, for example, lands, electrodes, or metal parts. In the present embodiment, nine first pads 21 and four second pads 22 are provided on the substrate 12.

The first pads 21 and the second pads 22 are located closer to the front end 12c than to the rear end 12d. The front end 12c is an example of one edge that forms the short side of the substrate. The rear end 12d is an example of another edge that forms the short side of the substrate.

In the first embodiment, the first pads 21 are mounted on the first face 12a of the substrate 12. As illustrated in FIG. 3, the second pads 22 are mounted on the second face 12b. In the first embodiment, the first pads 21 and the second pads 22 are aligned along the short side of the substrate 12. In other words, the first pads 21 and the second pads 22 are aligned along the front end 12c. The first pads 21 and the second pads 22 may be aligned in another direction.

As illustrated in FIG. 2, in the first embodiment, the third pads 23 are mounted on the first face 12a of the substrate 12. The third pads 23 may be mounted on the second face 12b, for example. The third pads 23 are apart from the front end 12c in the negative direction along the Y axis.

Each of the two holes 24 penetrates through the substrate 12 in the Z axis direction. In other words, the holes 24 are open to the first face 12a and the second face 12b. The two holes 24 are aligned in the X axis direction. The first pads 21 and the second pads 22 are arranged between the two holes 24 in the X axis direction. The first pads 21 may be arranged at a different location.

As illustrated in FIG. 3, the flash memory 13 is mounted on the second face 12b of the substrate 12. For example, terminals of the flash memory 13 are electrically connected to electrodes provided to the second face 12b by soldering. The flash memory 13 may be mounted on the first face 12a. Moreover, multiple flash memories 13 may be mounted on both the first face 12a and the second face 12b.

The flash memory 13 is, for example, a NAND flash memory. Note that the USB drive 10 should not be limited to NAND flash memory and may include another non-volatile memory such as NOR flash memory, magnetoresistive memory (Magnetoresistive Random Access Memory: MRAM), phase change memory (Phase change Random Access Memory: PRAM), resistive memory (Resistive Random Access Memory: ReRAM) or ferroelectric memory (Ferroelectric Random Access Memory: FeRAM).

As illustrated in FIG. 2, the controller 14 is mounted on the third pads 23 provided to the first face 12a of the substrate 12. Terminals of the controller 14 are electrically connected by soldering, for example, to the third pads 23. The controller 14 may be mounted on the second face 12b. For example, the controller 14 controls the flash memory 13 and controls communication between the USB drive 10 and a host.

The first plug 15 is, for example, a male connector compliant with USB3.1 Type-A standard or USB3.0 Type-A standard. USB3.1 standard includes USB3.1 Type-A standard. USB3.0 standard includes USB3.0 Type-A standard. Each of USB3.1 standard and USB3.0 standard is an example of a first USB standard. USB3.1 Type-A standard and USB3.0 Type-A standard are included in USB Type-A standard.

The first plug 15 is fixed to the substrate 12 so as to project in the positive direction along the Y axis from the front end 12c of the substrate 12. The first plug 15 is mounted on the first face 12a of the substrate 12. For example, the first plug 15 may be accommodated in a cutoff in the substrate 12.

The first plug 15 includes a housing 31, a terminal board 32, and pins 33. The pins 33 may also be referred to as, for example, signal terminals, terminals, connections, conductors, or members. In the present embodiment, the first plug 15 includes nine pins 33.

The housing 31 is made from metal. The housing 31 may be made from another material. The housing 31 houses at least a part of the terminal board 32 and at least parts of the pins 33.

The housing 31 has a front edge 31a and a base edge 31b. The front edge 31a is an edge of the housing 31 in the positive direction along the Y axis. The base edge 31b is an edge of the housing 31 in the negative direction along the Y axis.

The housing 31 further includes a tubular part 35 and a fixing part 36. The tubular part 35 has a substantially rectangular tube shape extending in the Y axis direction. The fixing part 36 is provided to the base edge 31b of the housing 31 and has two projections 36a. The projections 36a project in the negative direction along the Z axis.

The terminal board 32 is, for example, a board made from an insulating material. The terminal board 32 is colored in blue. The terminal board 32 has a front face 32a. The front face 32a is apart from an internal face of the tubular part 35 of the housing 31 and faces in the positive direction along the Z axis.

The pins 33 are made from a conductor such as metal and extend in the Y axis direction. The pins 33 have contact edges 33a and mounting edges 33b. The contact edges 33a are one edges of the pins 33. The mounting edges 33b are the other edges of the pins 33.

The contact edges 33a of the pins 33 are fixed to the terminal board 32, arranged on the front face 32a of the terminal board 32, or project from the front face 32a. The mounting edges 33b of the pins 33 project in the negative direction along the Y axis from the base edge 31b of the housing 31.

In the present embodiment, four of the contact edges 33a are aligned in the X axis direction. The remaining five contact edges 33a are located further in the negative direction along the Y axis than the contact edges 33a of the four pins 33 and arranged in the X axis direction. In other words, the contact edges 33a of the four pins 33 and the contact edges 33a of the five pins 33 are arranged substantially in parallel to each other.

The mounting edges 33b of the nine pins 33 are mounted on the nine first pads 21 by soldering, for example. The projection 36a of the housing 31 inserts through the hole 24 of the substrate 12 and is fixed to the substrate 12 by soldering, for example. The housing 31 is electrically connected to the ground pattern of the substrate 12 via the projection 36a, for example. Thereby, the first plug 15 is mounted on the substrate 12.

The structure of the first plug 15 should not be limited to the structure described above. For example, the terminal board 32 may be a PCB. In this case, electrodes serving as terminals of the first plug 15 are mounted on the terminal board 32. The electrodes are, for example, metal films formed on the front face 32a of the terminal board 32, and electrically connected to the pins 33 projecting from the base edge 31b of the housing 31.

As illustrated in FIG. 3, a second plug 40 may be attached to the substrate 12 instead of the first plug 15, for example. The second plug 40 is an example of second connector. For example, the second plug 40 is a male connector compliant with USB2.0 Type-A standard. USB2.0 standard includes USB2.0 Type-A standard. USB2.0 standard is an example of a second USB standard. USB2.0 Type-A standard is included in USB Type-A standard.

The second plug 40 is attached to the substrate 12 so as to project in the positive direction along the Y axis from the front end 12c of the substrate 12 as with the first plug 15. The second plug 40 is mounted on the second face 12b of the substrate 12. The second plug 40 includes a housing 41, a terminal board 42, and pins 43. In the present embodiment, the second plug 40 includes four pins 43.

The housing 41 is made from metal. The housing 41 may be made from another material. The housing 41 houses at least a part of the terminal board 42 and at least parts of the pins 43.

The housing 41 has a front edge 41a and a base edge 41b. The front edge 41a is an edge of the housing 41 in the positive direction along the Y axis. The base edge 41b is an edge of the housing 41 in the negative direction along the Y axis.

The housing 41 further has a tubular part 45 and a fixing part 46. The tubular part 45 has a substantially rectangular tubular shape extending in the Y axis direction. The fixing part 46 is provided to the base edge 41b of the housing 41 and has two projections 46a. The projection 46a projects in the positive direction along the Z axis.

The terminal board 42 is a board made from an insulating material, for example. The terminal board 42 is colored in black, for example. The terminal board 42 has a front face 42a. The front face 42a is apart from an internal face of the tubular part 45 of the housing 41 and faces in the negative direction along the Z axis.

The pins 43 are made of a conductor such as metal and extend in the Y axis direction roughly as a whole. The pins 43 each have a contact edge 43a and a mounting edge 43b. The contact edge 43a is one edge of the pin 43. The mounting edge 43b is the other edge of the pin 43.

The contact edges 43a of the pins 43 are fixed to the terminal board 42 and arranged on the front face 42a of the terminal board 42. The mounting edges 43b of the pins 43 project in the negative direction along the Y axis from the base edge 41b of the housing 41. In the present embodiment, the contact edges 43a of the four pins 43 are aligned in the X axis direction.

For mounting the second plug 40 on the substrate 12, the mounting edges 43b of the four pins 43 are attached to the four second pads 22 by soldering, for example. The projection 46a of the housing 41 inserts through the hole 24 of the substrate 12 and is fixed to the substrate 12 by soldering, for example. For example, the housing 41 is electrically connected to the ground pattern of the substrate 12 via the projection 46a. Thereby, the second plug 40 is mounted on the substrate 12. The second plug 40 should not be limited to the one described above.

As illustrated in FIG. 2, the first plug 15 can be connected to a first socket 50 represented by the two-dot chain line, for example. The first socket 50 is an example of first external connector and may also be referred to as, for example, connector, receptacle, or connection. The direction in which the first plug 15 is connected to the first socket 50 is along the Y axis. In the present embodiment, the first socket 50 is a female connector compliant with USB3.1 Type-A standard or USB3.0 Type-A standard.

The first plug 15 does not have to be complied with USB3.1 Type-A standard or USB3.0 Type-A standard as long as it can be connected to the first socket 50. For example, the first plug 15 may be another connector that is compatible with USB3.1 Type-A standard.

The first socket 50 is incorporated in a host device such as portable computer, tablet, television receiver, display, smartphone, mobile phone, and consumer electronics. The USB drive 10 can communicate with the host device via the first plug 15 and the first socket 50. The first socket 50 may be incorporated in another electronic device such as cable and adapter for connecting devices.

Figure 4:
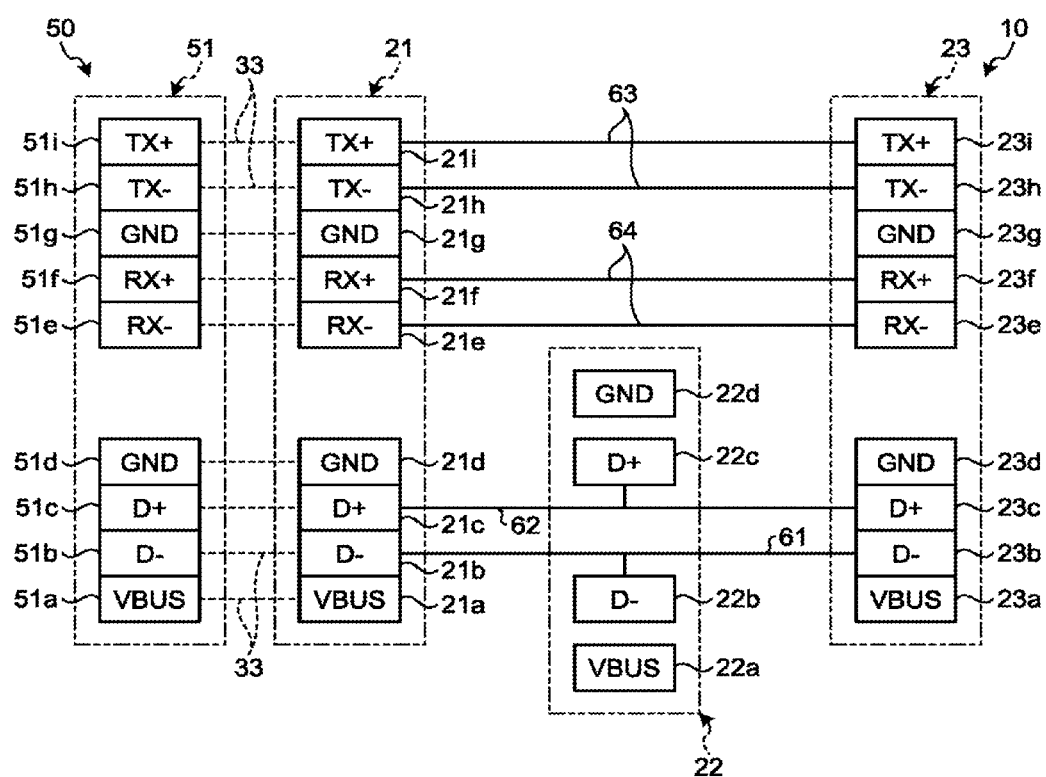
FIG. 4 schematically illustrates an example of connection among first pads, second pads, third pads, and terminals of a first socket according to the first embodiment.

FIG. 4 schematically illustrates an example of connection among the first pads 21, the second pads 22, the third pads 23, and terminals 51 of the first socket 50 according to the first embodiment. In FIG. 4, for the purpose of explanation, the first pads 21, the second pads 22, the third pads 23, and the terminals 51 are each surrounded by the two-dot chain line and may be collectively denoted by reference numerals as groups. As illustrated in FIG. 4, the first socket 50 includes the terminals 51. In other words, the terminals 51 are incorporated in the first socket 50. The terminals 51 are an example of first external terminal.

When the first plug 15 illustrated in FIG. 2 is connected to the first socket 50, a part of the first socket 50 is inserted into the first plug 15. The contact edges 33a of the pins 33 contact the corresponding terminals 51. Thereby, the first pads 21 are electrically connected to the terminals 51 of the first socket 50 via the pins 33. In FIG. 4, the pins 33 that electrically connect the first pads 21 and the terminals 51 are schematically represented by the broken lines.

The first socket 50 compliant with USB3.1 Type-A standard has nine terminals 51. Four of the terminals 51 are aligned in the X axis direction. The remaining five terminals 51 are located more inside than the four terminals 51 and aligned in the X axis direction. In other words, the four terminals 51 and the five terminals 51 are arranged substantially in parallel to each other.

The terminal group 51 includes a power supply (VBUS) terminal 51a, a negative differential signal (D−) terminal 51b, a positive differential signal (D+) terminal 51c, a ground (GND) terminal 51d, a negative (RX−) reception differential signal terminal 51e, a positive reception differential signal (RX+) terminal 51f, a ground (GND) terminal 51g, a negative transmission differential signal (TX−) terminal 51h, and a positive transmission differential signal (TX+) terminal 51i.

The VBUS terminal 51a and the GND terminals 51d and 51g are power supply terminals. The D− terminal 51b and the D+ terminal 51c are data communication terminals compliant with USB2.0 standard. For example, the D− terminal 51b and the D+ terminal 51c are used for low-speed, full-speed, and high-speed communication by the USB standard.

The RX− terminal 51e, the RX+ terminal 51f, the TX− terminal 51h, and the TX+ terminal 51i are data communication terminals compliant with USB3.0 standard and USB3.1 Gen1 standard. USB3.1 standard includes USB3.1 Gen1 standard. For example, the RX− terminal 51e, the RX+ terminal 51f, the TX− terminal 51h, and the TX+ terminal 51i are used for super-speed communication by the USB standard.

In the first embodiment, the first pad group 21 is complied with USB 3.1 Type-A standard or the USB 3.0 Type-A standard. The first pad group 21 includes a power supply (VBUS) pad 21a, a differential signal negative (D−) pad 21b, a differential signal positive (D+) pad 21c, a ground (GND) pad 21d, a negative reception differential signal (RX−) pad 21e, a positive (RX+) reception differential signal (RX+) pad 21f, a ground (GND) pad 21g, a negative transmission differential signal (TX−) pad 21h, and a positive transmission differential signal (TX+) pad 21i.

Each of the D− pad 21b and the D+ pad 21c is an example of one of the first conductors to which the first wiring is connected. Each of the TX− pad 21h and the TX+ pad 21i is an example of one of the first conductors to which the second wiring is connected.

As illustrated in FIG. 4, when the first plug 15 is connected to the first socket 50, the VBUS pad 21a is electrically connected to the VBUS terminal 51a via the pin 33. Moreover, the D− pad 21b is electrically connected to the D− terminal 51b, the D+ pad 21c is electrically connected to the D+ terminal 51c, the GND pad 21d is electrically connected to the GND terminal 51d, the RX− pad 21e is electrically connected to the RX− terminal 51e, the RX+ pad 21f is electrically connected to the RX+ terminal 51f, the GND pad 21g is electrically connected to the GND terminal 51g, the TX− pad 21h is electrically connected to the TX− terminal 51h, and the TX+ pad 21i is electrically connected to the TX+ terminal 51i via the pins 33.

In the first embodiment, the second pad group 22 is complied with USB 2.0 Type-A standard. The second pad group 22 includes a power supply (VBUS) pad 22a, a negative differential signal (D−) pad 22b, a positive differential signal (D+) pad 22c, and a ground (GND) pad 22d. Each of the D− pad 22b and the D+ pad 22c is an example of one of the second conductors to which the first wiring is connected.

The third pad group 23 includes a power supply (VBUS) pad 23a, a negative differential signal (D−) pad 23b, a positive differential signal (D+) pad 23c, a ground (GND) pad 23d, a negative reception differential signal (RX−) pad 23e, a positive reception differential signal (RX+) pad 23f, a ground (GND) pad 23g, a negative transmission differential signal (TX−) pad 23h, and a positive transmission differential signal (TX+) pad 23i.

The VBUS pad 23a and the GND pad 23d are electrically connected to a power supply terminal of the controller 14. The D− pad 23b and the D+ pad 23c are electrically connected to a data communication terminal, compliant with USB2.0 standard, of the controller 14. The RX− pad 23e, the RX+ pad 23f, the TX− pad 23h, and the TX+ pad 23i are electrically connected to a data communication terminal, compliant with USB3.0 standard and USB3.1 Gen1 standard, of the controller 14.

A first wiring pattern 61, a second wiring pattern 62, two third wiring patterns 63, and two fourth wiring patterns 64 are laid on the substrate 12. Each of the first wiring pattern 61 and the second wiring pattern 62 is an example of first wiring. Each of the two third wiring patterns 63 is an example of second wiring. The first to fourth wiring patterns 61 to 64 may also be referred to as, for example, conductor or connection.

The first wiring pattern 61 connects the D− pad 21b of the first pad group 21, the D− pad 22b of the second pad group 22, and the D− pad 23b of the third pad group 23. In other words, the first wiring pattern 61 connects one of the first pads 21, one of the second pads 22, and one of the third pads 23.

The second wiring pattern 62 connects the D+ pad 21c of the first pad group 21, the D+ pad 22c of the second pad group 22, and the D+ pad 23c of the third pad group 23. In other words, the second wiring pattern 62 connects one of the first pads 21, one of the second pads 22, and one of the third pads 23.

One of the third wiring patterns 63 connects the TX+ pad 21i of the first pad group 21 and the TX+ pad 23i of the third pad group 23. The other third wiring pattern 63 connects the TX− pad 21h of the first pad group 21 and the TX− pad 23h of the third pad group 23. In other words, each of the third wiring patterns 63 connects one of the first pads 21 and one of the third pads 23.

One of the fourth wiring patterns 64 connects the RX+ pad 21f of the first pad group 21 and the RX+ pad 23f of the third pad group 23. The other fourth wiring pattern 64 connects the RX− pad 21e of the first pad group 21 and the RX− pad 23e of the third pad group 23. In other words, each of the fourth wiring patterns 64 connects one of the first pads 21 and one of the third pads 23.

The third wiring pattern 63 is electrically isolated from the second pad group 22. The fourth wiring pattern 64 is also electrically isolated from the second pad group 22.

Other wirings are provided on the substrate 12. For example, the other wirings connect the VBUS pads 21a, 22a, and 23a to a power supply pattern of the substrate 12 and connect the GND pads 21d, 21g, 22d, 23d, and 23g to a ground pattern of the substrate 12. In case of using the substrate 12 including stacked layers, the VBUS pads 21a, 22a, and 23a may be connected to a power supply layer of the substrate 12 and the GND pads 21d, 21g, 22d, 23d, and 23g may be connected to a ground layer of the substrate 12.

Figure 5:
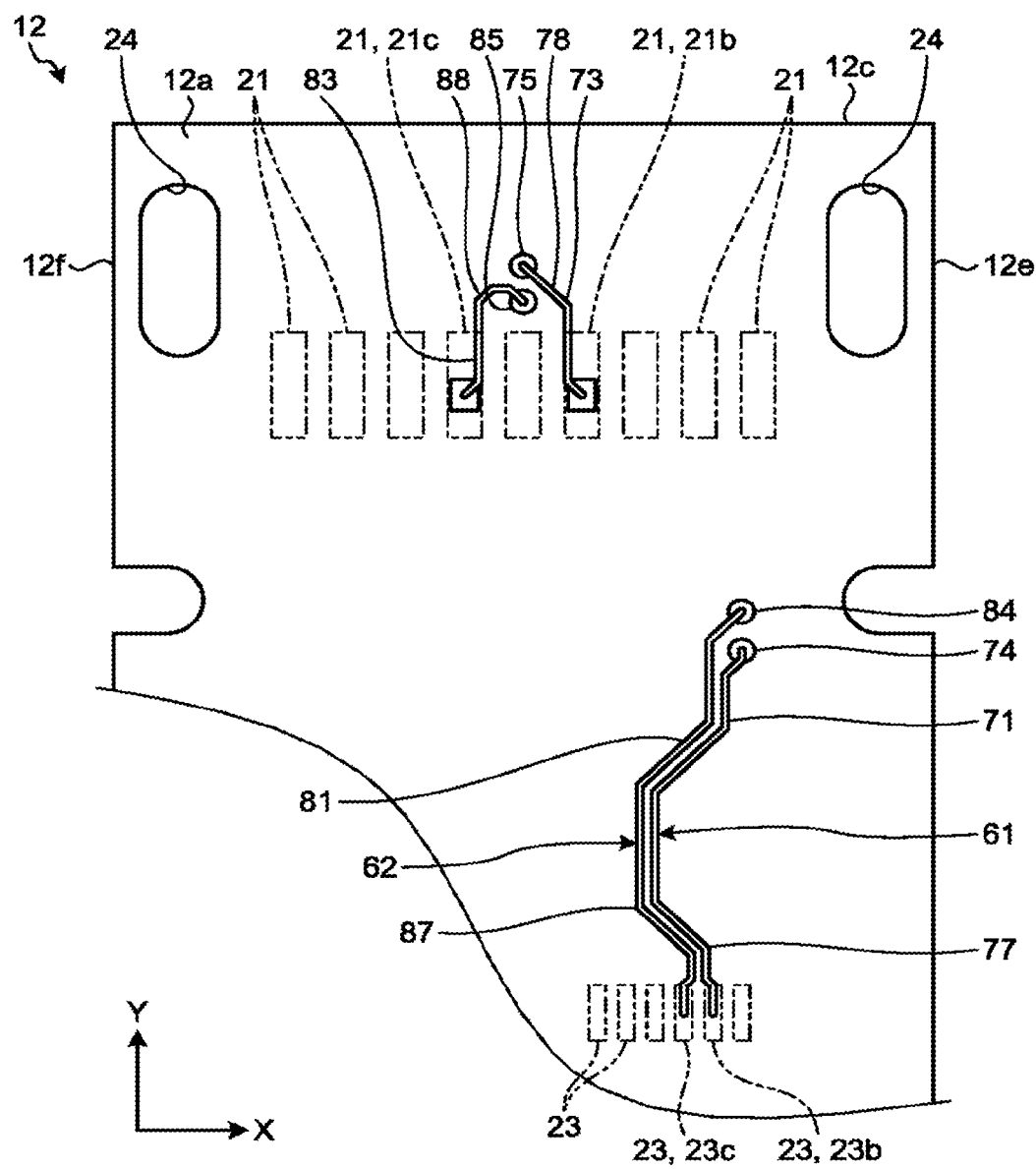
FIG. 5 is a schematic plan view of a first face of a substrate according to the first embodiment.
Figure 6:
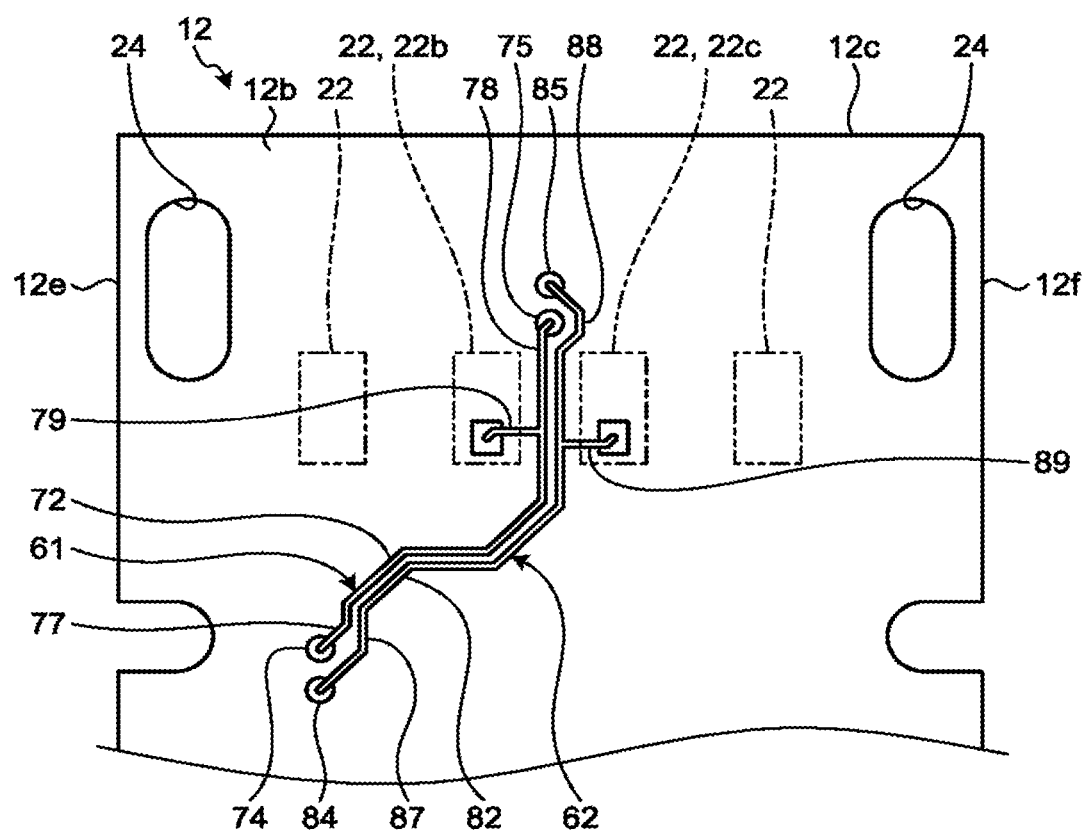
FIG. 6 is a schematic plan view of a second face of the substrate according to the first embodiment.

FIG. 5 is a schematic plan view of the first face 12a of the substrate 12 according to the first embodiment. FIG. 6 is a schematic plan view of the second face 12b of the substrate 12 according to the first embodiment. As illustrated in FIGS. 5 and 6, the first wiring pattern 61 includes a first extension 71, a second extension 72, a third extension 73, a first via 74, and a second via 75.

Each of the first extension 71 and the third extension 73 is an example of first part. The second extension 72 is an example of second part. The second via 75 is an example of third part.

The first extension 71 and the third extension 73 are parts of the first wiring pattern 61 that are laid on the first face 12a. The second extension 72 is a part of the first wiring pattern 61 that is laid on the second face 12b. The first via 74 and the second via 75 are through holes, for example.

As illustrated in FIG. 5, one edge of the first extension 71 is connected to the D− pad 23b of the third pad group 23. The other edge of the first extension 71 is connected to the second extension 72 through the first via 74.

As illustrated in FIG. 6, one edge of the second extension 72 is connected to the first via 74. The other edge of the second extension 72 is connected to the third extension 73 through the second via 75. In other words, the second via 75 connects the second extension 72 and the third extension 73.

The first via 74 is separated further from the front end 12c of the substrate 12 than the second pad group 22 in the long side direction of the substrate 12. The second via 75 is located between the second pad group 22 and the front end 12c in the long side direction of the substrate 12. Moreover, the second via 75 is located between the front end 12c and the first pad group 21 in the long side direction of the substrate 12 in FIG. 5.

The second extension 72 extends between the two adjacent second pads 22 and between the first via 74 and the second via 75. The second extension 72 is branched and connected to the D− pad 22b of the second pad group 22.

As illustrated in FIG. 5, one edge of the third extension 73 is connected to the second via 75. The other edge of the third extension 73 is connected to the D− pad 21b of the first pad group 21.

As illustrated in FIGS. 5 and 6, the first wiring pattern 61 includes a common part 77, a first branch 78, and a second branch 79. The common part 77 includes the first extension 71, the first via 74, and a part of the second extension 72. The first branch 78 includes a part of the second extension 72, the second via 75, and the third extension 73. The second branch 79 includes a part of the second extension 72.

The common part 77 is connected to the D− pad 23b of the third pad group 23. The first branch 78 connects an edge of the common part 77 and the D− pad 21b of the first pad group 21. The second branch 79 connects the edge of the common part 77 and the D− pad 22b of the second pad group 22.

The length of the first branch 78 is shorter than the length of the common part 77. The length of the second branch 79 is shorter than the length of the common part 77 and the length of the first branch 78.

As illustrated in FIGS. 5 and 6, the second wiring pattern 62 includes a first extension 81, a second extension 82, a third extension 83, a first via 84, and a second via 85 as with the first wiring pattern 61.

The first extension 81 and the third extension 83 are parts of the second wiring pattern 62 that are laid on the first face 12a. The second extension 82 is a part of the second wiring pattern 62 that is laid on the second face 12b. The first via 84 and the second via 85 are through holes, for example.

As illustrated in FIG. 5, one edge of the first extension 81 is connected to the D+ pad 23c of the third pad group 23. The other edge of the first extension 81 is connected to the second extension 82 through the first via 84.

As illustrated in FIG. 6, one edge of the second extension 82 is connected to the first via 84. The other edge of the second extension 82 is connected to the third extension 83 through the second via 85. In other words, the second via 85 connects the second extension 82 and the third extension 83.

The first via 84 is further apart from the front end 12c of the substrate 12 than the second pad group 22 along the long side of the substrate 12. The second via 85 is located between the second pad group 22 and the front end 12c along the long side of the substrate 12. Moreover, the second via 85 is located between the first pad group 21 and the front end 12c along the long side of the substrate 12.

The second extension 82 extends between the two adjacent second pads 22 and between the first via 84 and the second via 85. The second extension 82 is branched and connected to the D+ pad 22c of the second pad group 22.

As illustrated in FIG. 5, one edge of the third extension 83 is connected to the second via 85. The other edge of the third extension 83 is connected to the D+ pad 21c of the first pad group 21.

The second wiring pattern 62 includes a common part 87, a first branch 88, and a second branch 89. The common part 87 includes the first extension 81, the first via 84, and a part of the second extension 82. The first branch 88 includes a part of the second extension 82, the second via 85, and the third extension 83. The second branch 89 includes a part of the second extension 82.

The common part 87 is connected to the D+ pad 23c of the third pad group 23. The first branch 88 connects an edge of the common part 87 and the D+ pad 21c of the first pad group 21. The second branch 89 connects the edge of the common part 87 and the D+ pad 22c of the second pad group 22.

The length of the first branch 88 is shorter than the length of the common part 87. The length of the second branch 89 is shorter than the length of the common part 87 and the length of the first branch 88.

The first wiring pattern 61 and the second wiring pattern 62 may be laid differently from the above. For example, the first extension 71 or the third extension 73 of the first wiring pattern 61 may extend between any adjacent first pads 21. The first extension 81 or the third extension 83 of the second wiring pattern 62 may extend between any adjacent first pads 21.

Figure 7:
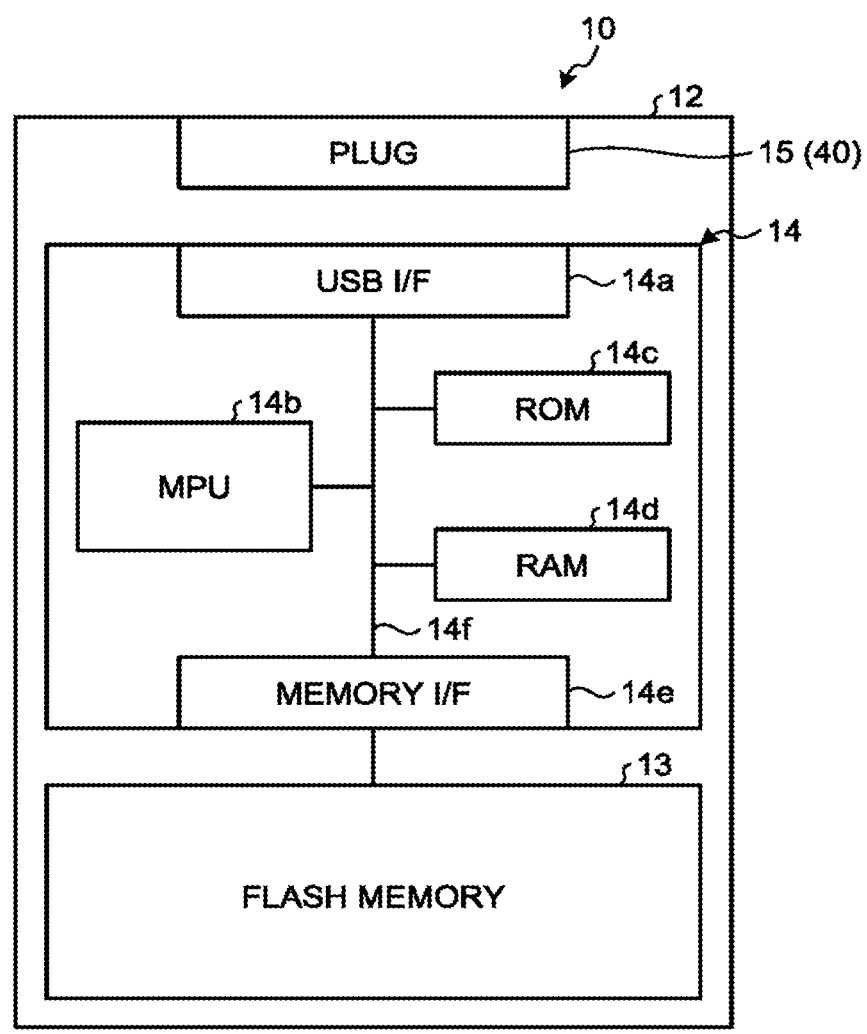
FIG. 7 is a block diagram illustrating an example of a configuration of the USB drive according to the first embodiment.

FIG. 7 is a block diagram illustrating an example of a configuration of the USB drive 10 according to the first embodiment. As illustrated in FIG. 7, the controller 14 controls transmission of data between the first plug 15 or the second plug 40 and the flash memory 13. FIG. 7 collectively shows the first plug 15 and the second plug 40 as the plug 15 (40). The following will describe a case that the first plug 15 is mounted on the substrate 12.

The controller 14 includes a USB interface (I/F) 14a, an MPU 14b, a ROM 14c, a RAM 14d, a memory interface (I/F) 14e, and an internal bus 14f. The USB I/F 14a, the MPU 14b, the ROM 14c, the RAM 14d, the memory I/F 14e, and the internal bus 14f are formed on one semiconductor substrate, for example.

The USB I/F 14a receives data and commands from the host device via the first plug 15. The data and the commands are written in the standard format of SCSI (Small Computer System Interface), for example. The USB I/F 14a receives data from the flash memory 13 and outputs the data in the standard format of SCSI to the host device via the first plug 15.

The MPU 14b processes the commands received from the host device and the data received from the flash memory 13 using the ROM 14c and the RAM 14d, for example. Moreover, when the USB drive 10 is connected to the host device, the MPU 14b authenticates the host device and the USB drive 10.

The ROM 14c stores data and programs necessary for processing by the MPU 14b. The RAM 14d functions as a work area for processing by the MPU 14b. The RAM 14d is, for example, a volatile semiconductor memory such as DRAM.

The memory I/F 14e is connected to the flash memory 13 via wirings, for example. The memory I/F 14e transfers the commands and data received by the USB I/F 14a to the flash memory 13 in accordance with the instruction of the MPU 14b, and transfers the data read from the flash memory 13 to the USB I/F 14a.

The flash memory 13 reads and outputs data in accordance with read commands from the controller 14. The flash memory 13 writes data in accordance with write commands from the controller 14.

In the USB drive 10 described above, when the first plug 15 illustrated in FIG. 2 is connected to the first socket 50, the VBUS pad 23a, the D− pad 23b, the D+ pad 23c, the GND pad 23d, the RX− pad 23e, the RX+ pad 23f, the GND pad 23g, the TX− pad 23h, and the TX+ pad 23i of the third pads 23 in FIG. 4 are electrically connected to the VBUS terminal 51a, the D− terminal 51b, the D+ terminal 51c, the GND terminal 51d, the RX− terminal 51e, the RX+ terminal 51f, the GND terminal 51g, the TX− terminal 51h, and the TX+ terminal 51i of the first socket 50 via the VBUS pad 21a, the D− pad 21b, the D+ pad 21c, the GND pad 21d, the RX− pad 21e, the RX+ pad 21f, the GND pad 21g, the TX− pad 21h, and the TX+ pad 21i of the first pad group 21 and the pins 33, respectively. Thereby, the USB drive 10 and the host device can communicate data to each other in compliance with USB3.1 Gen1 standard, for example. For example, the USB drive 10 and the host device can communicate data with each other at super speed.

For example, the D− pad 21b and the D+ pad 21c of the first pad group 21 transmit a differential signal pair to the D− terminal 51b and the D+ terminal 51c of the first socket 50, and receive the differential signal pair from the D− terminal 51b and the D+ terminal 51c of the first socket 50. The differential signal is an example of signal. The D− pad 21b and the D+ pad 21c of the first pad group 21 transmit and receive a differential signal pair.

The TX− pad 21h and the TX+ pad 21i of the first pad group 21 transmit the differential signal pair to the TX− terminal 51h and the TX+ terminal 51i of the first socket 50. The transmission rate of the TX− pad 21h and the TX+ pad 21i is higher than the transmission rate of the D− pad 21b and the D+ pad 21c.

The RX− pad 21e and the RX+ pad 21f of the first pad group 21 receive the differential signal pair from the RX− terminal 51e and the RX+ terminal 51f of the first socket 50. The transmission rate of the RX− pad 21e and the RX+ pad 21f is higher than the transmission rate of the D− pad 21b and the D+ pad 21c.

As described, the USB drive 10 in which the first plug 15 is mounted on the first pad group 21 communicates data with the host device via the first socket 50. The second pad group 22 having no components mounted thereon are covered by the housing 11. That is, the second pad group 22 without components, the first pad group 21 with the first plug 15, and the third pads 23 with the controller 14 are connected via the first wiring pattern 61 and the second wiring pattern 62. For example, the second pad group 22 may be covered by an insulating seal.

In the present embodiment, the first wiring pattern 61 connects the D− pad 21b, the D− pad 22b, and the D− pad 23b even when the D− pad 21b and the D+ pad 21c of the first pad group 21 can transmit the differential signal pair to the first socket 50. The second wiring pattern 62 connects the D+ pad 21c, the D+ pad 22c, and the D+ pad 23c. That is, the D− pad 22b and the D+ pad 22c are not separated from the first wiring pattern 61 and the second wiring pattern 62 via a switch, for example.

As already described, the second plug 40 may be fixed to the substrate 12 instead of the above first plug 15. The USB drive 10 with the second plug 40 instead of the first plug 15 will be described below.

As illustrated in FIG. 3, the second plug 40 mounted on the substrate 12 can be connected to a second socket 90 represented by the two-dot chain line, for example. The second socket 90 is an example of second external connector, and may also be referred to as, for example, connector, receptacle, or connection. The direction in which the second plug 40 is connected to the second socket 90 is along the Y axis. The second socket 90 is a female connector compliant with USB2.0 Type-A standard. That is, the second socket 90 is different from the first socket 50.

The second plug 40 does not have to be complied with USB2.0 Type-A standard as long as it can be connected to the second socket 90. For example, the second plug 40 may be another connector compatible with USB2.0 Type-A standard.

Figure 8:
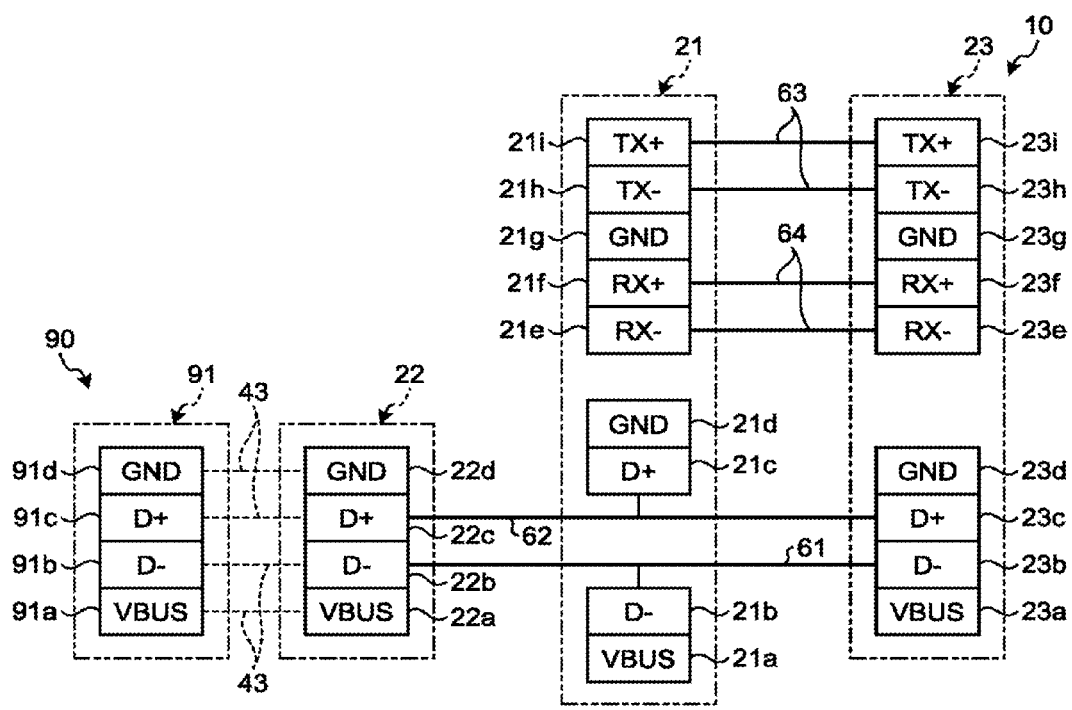
FIG. 8 schematically illustrates an example of connection among first pads, second pads, third pads, and terminals of a second socket according to the first embodiment.

FIG. 8 schematically illustrates an example of connection among the first pads 21, the second pads 22, the third pads 23, and terminals 91 of the second socket 90 according to the first embodiment. In FIG. 8, the first pads 21, the second pads 22, the third pads 23, and the terminals 91 are each surrounded by the two-dot chain line and may be collectively denoted by reference numerals as groups for explanation. As illustrated in FIG. 8, the second socket 90 includes terminals 91. In other words, the terminals 91 are incorporated in the second socket 90. The terminals 91 are an example of second external terminal.

When the second plug 40 is connected to the second socket 90, a part of the second socket 90 is inserted into the second plug 40. The contact edges 43a of the pins 43 come in contact with the corresponding terminals 91. Thereby, the second pads 22 are electrically connected to the terminals 91 of the second socket 90 via the pins 43. In FIG. 8, the pins 43 that electrically connect the second pads 22 and the terminals 91 are schematically represented by the broken lines.

The second socket 90 compliant with USB2.0 Type-A standard includes four terminals 91. The group of four terminals 91 are aligned in the X axis direction. The terminal group 91 includes a power supply (VBUS) terminal 91a, a negative differential signal (D−) terminal 91b, a positive differential signal (D+) terminal 91c, and a ground (GND) terminal 91d.

The VBUS terminal 91a and the GND terminal 91d are power supply terminals. The D− terminal 91b and the D+ terminal 91c are data communication terminals complied with USB2.0 standard. For example, the D− terminal 91b and the D+ terminal 91c are used for low-speed, full-speed, and high-speed communication by the USB standard.

As illustrated in FIG. 8, when the second plug 40 is connected to the second socket 90, the VBUS pad 22a is electrically connected to the VBUS terminal 91a via the pin 43. The D− pad 22b is electrically connected to the D− terminal 91b, the D+ pad 22c is electrically connected to the D+ terminal 91c, and the GND pad 22d is electrically connected to the GND terminal 91d via the pins 43.

When the second plug 40 is connected to the second socket 90, the VBUS pad 23a, the D− pad 23b, the D+ pad 23c, and the GND pad 23d of the third pad group 23 are electrically connected to the VBUS terminal 91a, the D− terminal 91b, the D+ terminal 91c, and the GND terminal 91d via the VBUS pad 22a, the D− pad 22b, the D+ pad 22c, and the GND pad 22d of the second pad group 22 via the pins 43, respectively. Thereby, the USB drive 10 and the host device can communicate data with each other in compliance with USB2.0 standard, for example. For example, the USB drive 10 and the host device can communicate data with each other at high speed.

For example, the D− pad 22b and the D+ pad 22c of the second pad group 22 transmit a differential signal pair to the D− terminal 91b and the D+ terminal 91c of the second socket 90, and receive the differential signal pair from the D− terminal 91b and the D+ terminal 91c of the second socket 90. The D− pad 22b and the D+ pad 22c of the second pad group 22 transmit and receive the differential signal pair.

As described, the USB drive 10 having the second plug 40 mounted on the second pad group 22 communicates data with the host device via the second socket 90. The first pad group 21 do not have components mounted thereon and are covered by the housing 11. That is, the first pad group 21 without components, the second pad group 22 with the second plug 40, and the third pad group 23 are connected via the first wiring pattern 61 and the second wiring pattern 62. The first pad group 21 may be covered by an insulating seal, for example.

In the present embodiment, the first wiring pattern 61 also connects the D− pad 21b, the D− pad 22b, and the D− pad 23b of the second pad group 22 when the D− pad 22b and the D+ pad 22c can transmit the differential signal pair to the second socket 90. The second wiring pattern 62 connects the D+ pad 21c, the D+ pad 22c, and the D+ pad 23c. That is, the D− pad 21b and the D+ pad 21c are not separated from the first wiring pattern 61 and the second wiring pattern 62 via a switch, for example.

In case of mounting the second plug 40 on the substrate 12, the controller 14 that can communicate data in compliance with USB3.1 Gen1 standard is mounted on the substrate 12. That is, the controller 14 can transmit the differential signal pair to the first socket 50 via the TX− pad 21h and the TX+ pad 21i and receive the differential signal pair from the first socket 50 via the RX− pad 21e and the RX+ pad 21f when the second plug 40 is replaced with the first plug 15 and the first plug 15 is connected to the first socket 50. The controller 14 transmits the differential signal pair to the first socket 50 via the TX− pad 21h and the TX+ pad 21i at a transmission rate higher than via the D− pad 21b and the D+ pad 21c. The controller 14 receives the differential signal pair form the first socket 50 via the RX− pad 21e and the RX+ pad 21f at a transmission rate higher than via the D− pad 21b and the D+ pad 21c.

In case of mounting the second plug 40 on the substrate 12, the controller 14 that can communicate data in compliance with USB2.0 standard may be mounted on the substrate 12. That is, the third pads 23 may be pin-compatible.

In the USB drive 10 according to the first embodiment described above, the first wiring pattern 61 electrically connects one of the first pad group 21 electrically connected to the first socket 50, one of the second pad group 22 electrically connectable to the second socket 90, and one of the third pad group 23 on which the controller 14 is mounted. This makes it possible to mount the second plug 40 on the substrate 12 instead of the first plug 15 without a change in the design of the substrate 12. That is, the substrate 12 according to the present embodiment can selectively have the first plug 15 and the second plug 40 mounted thereon, enabling the manufacturer of the USB drive 10 to easily adjust the manufacturing ratio between two types of the USB drive 10, i.e., the USB drive 10 including the first plug 15 and the USB drive 10 including the second plug 40.

Moreover, the USB drive 10 including the first plug 15 and the USB drive 10 including the second plug 40 can use common parts other than the first plug 15 and the second plug 40. It is thus possible to conduct the common evaluation test for the parts other than the first plug 15 and the second plug 40, reducing the man-hour for the evaluation test of the USB drive 10.

The first pads 21 are placed on the first face 12a while the second pads 22 are placed on the second face 12b. This makes it possible to set larger parts of the first face 12a and the second face 12b to be available for mounting components than when the first pads 21 and the second pads 22 are placed on one of the first face 12a and the second face 12b.

The first pads 21 and the second pads 22 are aligned near the front end 12c in the same direction. Thus, the first pads 21 can be placed closer to the second pads 22, enabling a decrease in the length of the first wiring pattern 61. This can prevent a reduction in communication speed in the first plug 15 and the second plug 40. This can further reduce influence on the signal integrity in the first wiring pattern 61.

The second extension 72 extends between the two adjacent second pads 22. The second via 75 is located between the second pad group 22 and the front end 12c in the long side direction of the substrate 12. Thereby, for example, it is possible to set a larger part of the second face 12b to be available for mounting components and to reduce the possibility of short circuit between the second via 75 and the second pad group 22.

The first pad group 21 includes the TX− pad 21h and the TX+ pad 21i connected to the third wiring pattern 63 which is electrically isolated from the second pad group 22. The first plug 15 is different from the second plug 40 in that it is electrically connected to the TX− pad 21h and the TX+ pad 21i that are electrically isolated from the second pad group 22. That is, the substrate 12 according to the present embodiment can selectively have mounted thereon the first plug 15 and the second plug 40 that are different plugs, enabling the manufacturer of the USB drive 10 to easily adjust the manufacturing ratio between two types of USB drive 10, i.e., the USB drive 10 including the first plug 15 and the USB drive 10 including the second plug 40.

The TX− pad 21h and the TX+ pad 21i for USB3.1 or USB3.0 standard electrically isolated from the second pad group 22 transmit a differential signal pair to the first socket 50 at high speed. In case of mounting the first plug 15 on the substrate 12, the third pad group 23 can transmit a differential signal compliant with USB3.1 Gen1 standard, for example, to the first socket 50 via the D− pad 21b, the D+ pad 21c, the TX− pad 21h, and the TX+ pad 21i. On the other hand, in case of mounting the second plug 40 on the substrate 12, the third pad group 23 can transmit a differential signal compliant with USB2.0 standard, for example, to the second socket 90 via the D− pad 22b and the D+ pad 22c. Thus, the first plug 15 that can communicate in compliance with USB3.1 Gen1 standard and the second plug 40 that can communicate in compliance with USB2.0 standard can be selectively mounted on the substrate 12 without a change in the design of the substrate 12. USB3.1 Gen1 standard is capable of faster communication than USB2.0 standard.

The third pad group 23 on which the controller 14 that controls the flash memory 13 is mounted is located on the first face 12a as with the first pad group 21. On the other hand, the second pad group 22 is located on the second face 12b. That is, the controller 14 that controls the flash memory 13 and the first pad group 21 that transmits and receives a differential signal pair at a higher transmission rate are provided on the same first face 12a. This can shorten the length of the wiring between the first pad group 21 and the controller 14 and prevent reduction in the transmission rate in the first plug 15.

The first wiring pattern 61 includes the common part 77, and the first branch 78 and the second branch 79 branched from the common part 77. For example, in case of using no second pads 22, cutting off the second branch 79 can reduce influence on the signal integrity in the first wiring pattern 61.

The length of the first branch 78 is shorter than the length of the common part 77, and the length of the second branch 79 is also shorter than the length of the common part 77. That is, due to the shorter length of the branched part of the first wiring pattern 61, it is possible to reduce influence on the signal integrity in the first wiring pattern 61, for example.

When the first plug 15 is connected to the first socket 50, the controller 14 transmits a signal to the first socket 50 at a transmission rate higher than the transmission rate of the D− pad 21b and the D+ pad 21c via the TX− pad 21h and the TX+ pad 21i. Thereby, it is possible to mount the first plug 15 compliant with USB3.1 Type-A standard on the substrate 12 instead of the second plug 40 compliant with USB2.0 Type-A standard, for example, without a change in the design of the substrate 12. That is, it is possible to selectively mount the first plug 15 and the second plug 40 on the substrate 12 according to the present embodiment, enabling the manufacturer of the USB drive 10 to easily adjust the manufacturing ratio between two types of USB drive 10, i.e., the USB drive 10 including the first plug 15 and the USB drive 10 including the second plug 40.

Second Embodiment

A second embodiment will be described with reference to FIGS. 9 and 10. Note that, in the following embodiments, elements with the same functions as the elements already described are given the same reference numerals, and description thereof may be omitted. In addition, the elements denoted by the same reference numerals do not necessarily have the same functions and characteristics in all aspects, and they may have different functions and characteristics according to the respective embodiments.

Figure 9:
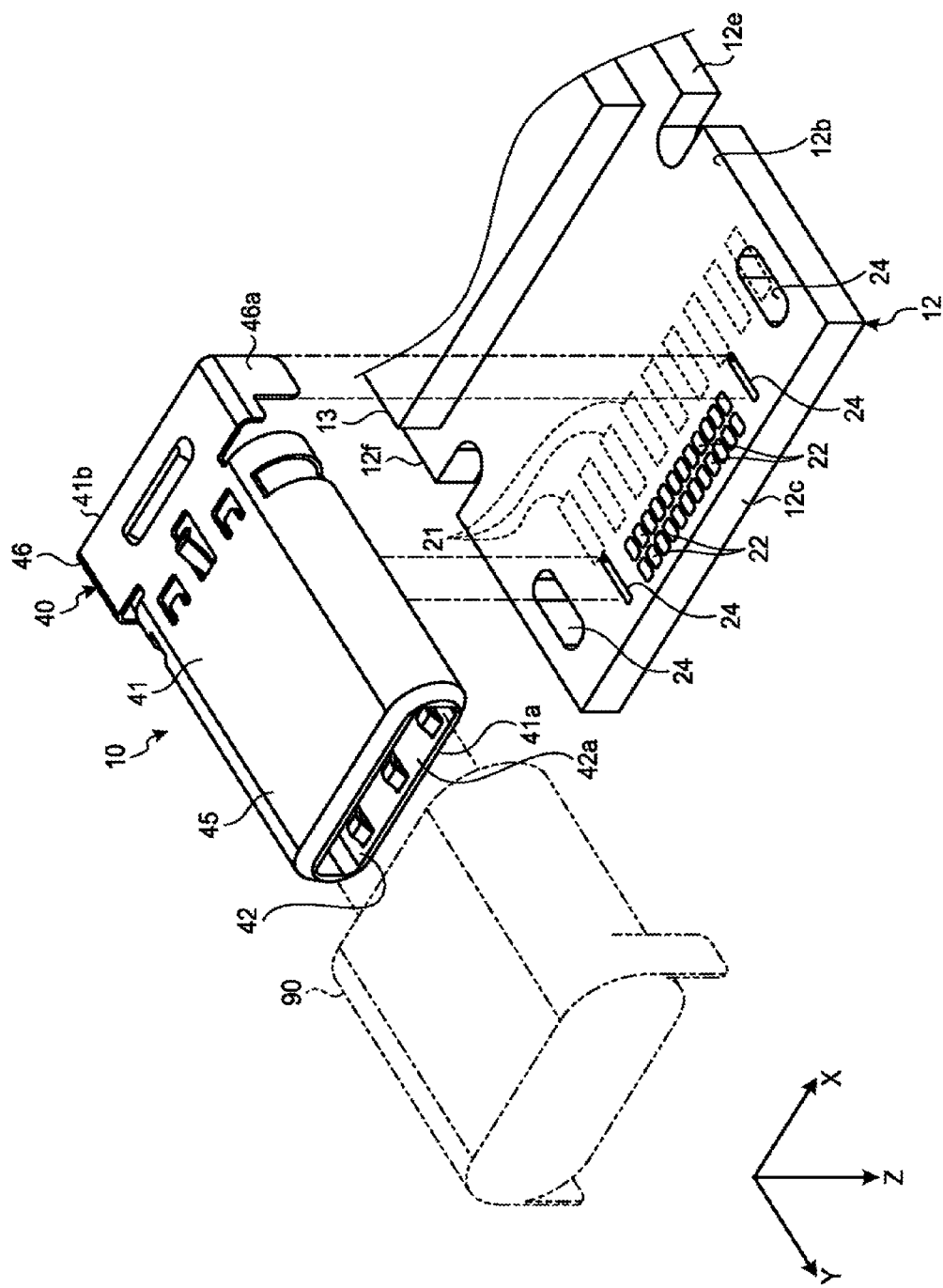
FIG. 9 is a perspective view of a part of a USB drive according to a second embodiment.

FIG. 9 is a perspective view of a part of a USB drive 10 according to the second embodiment. As illustrated in FIG. 9, in the second embodiment, nine first pads 21 and twenty-two second pads 22 are provided on a substrate 12. Two pads for fixing a second plug 40 are provided together with the twenty-two second pads 22, for example.

As with the first embodiment, a first plug 15 compliant with USB Type-A standard is mounted on the substrate 12. USB Type-A standard is an example of a first USB standard. In the second embodiment, the second plug 40 compliant with USB Type-C standard may be mounted on the substrate 12 instead of the first plug 15. USB Type-C standard is an example of a second USB standard. The second plug 40 includes twenty-two pins 43 although the pins 43 are hidden in FIG. 9.

The second plug 40 mounted on the substrate 12 can be connected to a second socket 90 represented by the two-dot chain line, for example. In the second embodiment, the second socket 90 is a female connector compliant with USB Type-C standard. That is, the second socket 90 is different from the first socket 50.

The second plug 40 can be connected to the second socket 90 in the posture shown in FIG. 9. The second plug 40 can be also connected to the second socket 90 in the posture turned by 180° from the posture shown in FIG. 9 in the Y axis direction (180° rotation around the Y axis).

The second plug 40 may not be complied with USB Type-C standard in so far as it is connectable to the second socket 90. For example, the second plug 40 may be another connector compatible with USB Type-C standard.

Figure 10:
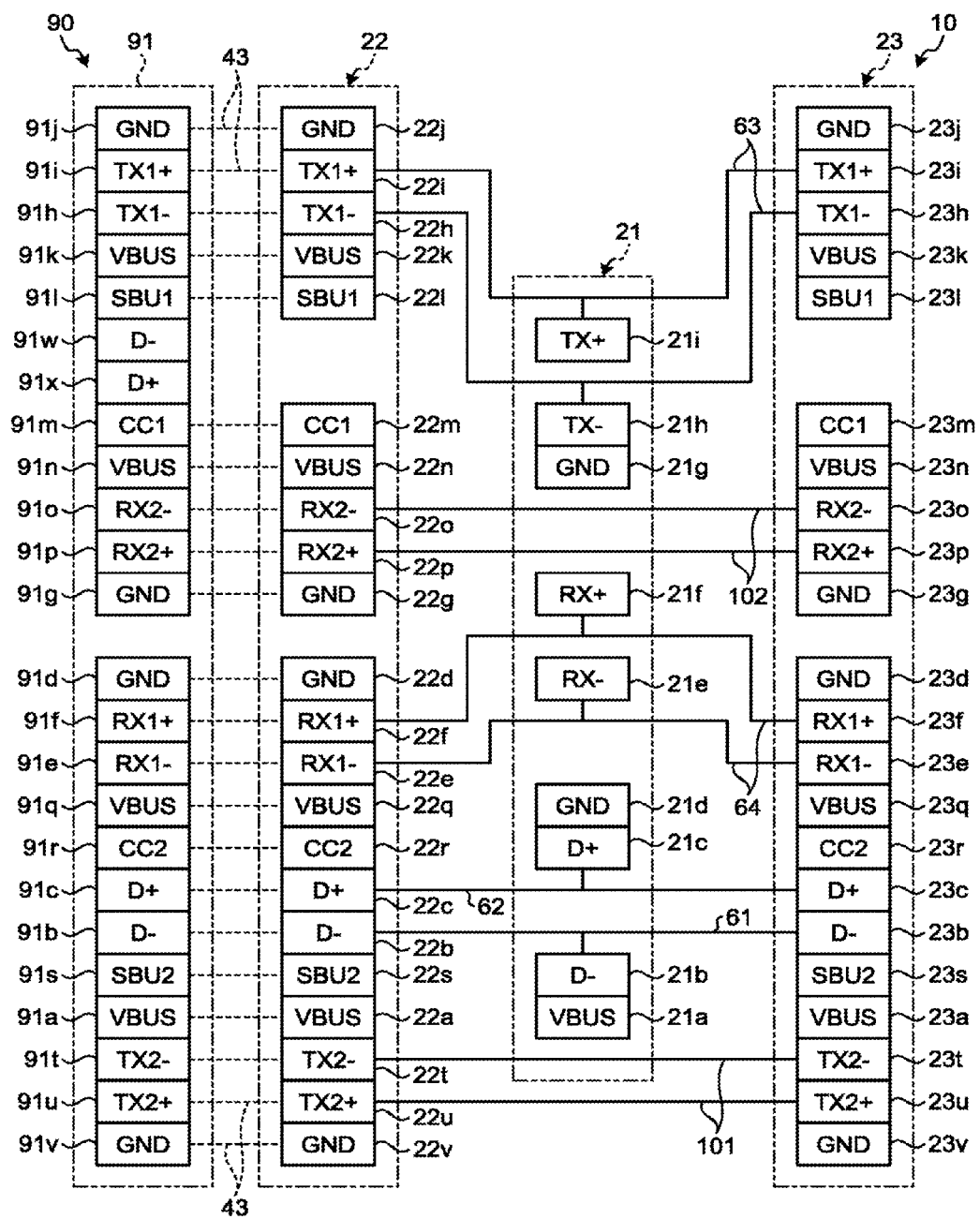
FIG. 10 schematically illustrates an example of connection among first pads, second pads, third pads, and terminals of a second socket according to the second embodiment.

FIG. 10 schematically illustrates an example of connection among the first pads 21, the second pads 22, third pads 23, and terminals 91 of the second socket 90 according to the second embodiment.

As illustrated in FIG. 10, the second pad group 22 includes a VBUS pad 22a, a D− pad 22b, a D+ pad 22c, and a GND pad 22d. In the second embodiment, the second pad group 22 further includes a first negative reception differential signal (RX1−) pad 22e, a first positive reception differential signal (RX1+) pad 22f, a ground (GND) pad 22g, a first negative transmission differential signal (TX1−) pad 22h, a first positive transmission differential signal (TX1+) pad 22i, a ground (GND) pad 22j, a power supply (VBUS) pad 22k, a first sideband use (SBU1) pad 22l, a first configuration channel signal (CC1) pad 22m, a power supply (VBUS) pad 22n, a second negative reception differential signal (RX2−) pad 22o, a second positive reception differential signal (RX2+) pad 22p, a power supply (VBUS) pad 22q, a second configuration channel signal (CC2) pad 22r, a second sideband use (SBU2) pad 22s, a second negative transmission differential signal (TX2−) pad 22t, a second positive transmission differential signal (TX2+) pad 22u, and a ground (GND) pad 22v.

Each of the TX1− pad 22h and the TX1+ pad 22i is an example of second conductors to which a second wiring is connected. Each of the TX2− pad 22t and the TX2+ pad 22u is an example of one of second conductors to which a third wiring is connected. Note that, when the first pads 21 are an example of second conductor and the second pads 22 are an example of first conductor, the second plug 40 may be an example of first connector, the first plug 15 may be an example of second connector, and each of the TX2− pad 22t and the TX2+ pad 22u may be an example of one of first conductors to which a second wiring is connected.

The third pad group 23 includes a VBUS pad 23a, a D− pad 23b, a D+ pad 23c, and a GND pad 23d. In the second embodiment, the third pad group 23 further includes a first negative reception differential signal (RX1−) pad 23e, a first positive reception differential signal (RX1+) pad 23f, a ground (GND) pad 23g, a first negative transmission differential signal (TX1−) pad 23h, a first positive transmission differential signal (TX1+) pad 23i, a ground (GND) pad 23j, a power supply (VBUS) pad 23k, a first sideband use (SBU1) pad 23l, a first configuration channel signal (CC1) pad 23m, a power supply (VBUS) pad 23n, a second negative reception differential signal (RX2−) pad 230, a second positive reception differential signal (RX2+) pad 23p, a power supply (VBUS) pad 23q, a second configuration channel signal (CC2) pad 23r, a second sideband use (SBU2) pad 23s, a second negative transmission differential signal (TX2−) pad 23t, a second positive transmission differential signal (TX2+) pad 23u, and a ground (GND) pad 23v.

The RX1− pad 23e, the RX1+ pad 23f, the TX1− pad 23h, the TX1+ pad 23i, the RX2− pad 230, the RX2+ pad 23p, the TX2− pad 23t, and the TX2+ pad 23u are electrically connected to a data communication terminal, compliant with USB3.1 Gen1 standard and USB3.1 Gen2 standard, of the controller 14. USB3.1 standard includes USB3.1 Gen2 standard.

In the second embodiment, one third wiring pattern 63 connects the TX+ pad 21i of the first pad group 21, the TX1+ pad 22i of the second pad group 22, and the TX1+ pad 23i of the third pad group 23. The other third wiring pattern 63 connects the TX− pad 21h of the first pad group 21, the TX1− pad 22h of the second pad group 22, and the TX1− pad 23h of the third pad group 23. In other words, each of the third wiring patterns 63 connects one of the first pads 21, one of the second pads 22, and one of the third pads 23.

One fourth wiring pattern 64 connects the RX+ pad 21f of the first pad group 21, the RX1+ pad 22f of the second pad group 22, and the RX1+ pad 23f of the third pad group 23. The other fourth wiring pattern 64 connects the RX− pad 21e of the first pad group 21, the RX1− pad 22e of the second pad group 22, and the RX1− pad 23e of the third pad group 23. In other words, each of the fourth wiring patterns 64 connects one of the first pads 21, one of the second pads 22, and one of the third pads 23.

Two fifth wiring patterns 101 and two sixth wiring patterns 102 are further provided on the substrate 12. Each of the two fifth wiring patterns 101 is an example of third wiring.

One fifth wiring pattern 101 connects the TX2+ pad 22u of the second pad group 22 and the TX2+ pad 23u of the third pad group 23. The other fifth wiring pattern 101 connects the TX2− pad 22t of the second pad group 22 and the TX2− pad 23t of the third pad group 23. In other words, each of the fifth wiring patterns 101 connects one of the second pads 22 and one of the third pads 23.

One sixth wiring pattern 102 connects the RX2+ pad 22p of the second pad group 22 and the RX2+ pad 23p of the third pad group 23. The other sixth wiring pattern 102 connects the RX2− pad 22o of the second pad group 22 and the RX2− pad 23o of the third pad group 23. In other words, each of the sixth wiring patterns 102 connects one of the second pads 22 and one of the third pads 23.

The fifth wiring patterns 101 are electrically isolated from the first pad group 21. The sixth wiring patterns 102 are electrically isolated from the first pad group 21.

When the second plug 40 is connected to the second socket 90, a part of the second socket 90 is inserted into the second plug 40. Contact edges 43a of the pins 43 come into contact with the corresponding terminals 91. Thereby, as illustrated in FIG. 10, the second pads 22 are electrically connected to the terminals 91 of the second socket 90 via the pins 43.

The second socket 90 compliant with USB Type-C standard includes twenty-four terminals 91. The twenty-four terminals 91 are aligned in the X axis direction. Twelve terminals 91 and the other twelve terminals 91 face each other in the Z axis direction.

The terminal group 91 includes a VBUS terminal 91a, a D− terminal 91b, a D+ terminal 91c, and a GND terminal 91d. In the second embodiment, the terminals 91 further include a first negative reception differential signal (RX1−) terminal 91e, a first positive reception differential signal (RX1+) terminal 91f, a ground (GND) terminal 91g, a first negative transmission differential signal (TX1−) terminal 91h, a first positive transmission differential signal (TX1+) terminal 91i, a ground (GND) terminal 91j, a power supply (VBUS) terminal 91k, a first sideband use (SBU1) terminal 91l, a first configuration channel signal (CC1) terminal 91m, a power supply (VBUS) terminal 91n, a second negative reception differential signal (RX2−) terminal 91o, a second positive reception differential signal (RX2+) terminal 91p, a power supply (VBUS) terminal 91q, a second configuration channel signal (CC2) terminal 91r, a second sideband use (SBU2) terminal 91s, a second negative transmission differential signal (TX2−) terminal 91t, a second positive transmission differential signal (TX2+) terminal 91u, a ground (GND) terminal 91v, a negative differential signal (D−) terminal 91w, and a positive differential signal (D+) terminal 91x.

The VBUS terminals 91a, 91k, 91n, and 91q and the GND terminals 91d, 91g, 91j, and 91v are power supply terminals. The D− terminals 91b and 91w and the D+ terminals 91c and 91x are data communication terminals compliant with USB2.0 standard. For example, the D− terminal 91b and the D+ terminal 91c are used for low-speed, full-speed, and high-speed communication by the USB standard.

The TX1+ terminal 91i, the TX1− terminal 91h, the RX1+ terminal 91f, the RX1− terminal 91e, the RX2+ terminal 91p, the RX2− terminal 91o, the TX2+ terminal 91u, and the TX2− terminal 91t are data communication terminals compliant with USB3.0 standard, USB3.1 Gen1 standard, and USB3.1 Gen2 standard. For example, the terminals 91i, 91h, 91f, 91e, 91p, 91o, 91u, and 91t are used for super-speed and super-speed-plus communication by the USB standard.

The CC1 terminal 91m and the CC2 terminal 91r are terminals for detecting a posture of the second plug 40 when inserted. That is, the CC1 terminal 91m and the CC2 terminal 91r determine the posture of the second plug 40 inserted in the second socket 90. For example, connected devices can perform negotiation for defining power feeding direction, current and voltage setting, and functions of each terminal through communication via the CC1 terminal 91m and the CC2 terminal 91r.

The second plug 40 may be mounted on a cable for connecting devices, for example. Such a cable may incorporate an ID chip. An ID chip stores information on the specification of the cable. When the cable is connected to a host device, the ID chip transmits information on the specification of the cable to the host device. The host device determines whether or not to allow communication with and power distribution to the cable on the basis of the information. The CC1 terminal 91m and the CC2 terminal 91r may be used for transmitting information on the specification of the cable.

As illustrated in FIG. 10, when the second plug 40 is connected to the second socket 90, the D− pad 22b is electrically connected to the D− terminal 91b, the D+ pad 22c is electrically connected to the D+ terminal 91c, the RX1− pad 22e is electrically connected to the RX1− terminal 91e, the RX1+ pad 22f is electrically connected to the RX1+ terminal 91f, the TX1− pad 22h is electrically connected to the TX1− terminal 91h, the TX1+ pad 22i is electrically connected to the TX1+ terminal 91i, the RX2− pad 220 is electrically connected to the RX2− terminal 91o, the RX2+ pad 22p is electrically connected to the RX2+ terminal 91p, the TX2− pad 22t is electrically connected to the TX2− terminal 91t, and the TX2+ pad 22u is electrically connected to the TX2+ terminal 91u, via the pins 43, for example. The rest of the second pads 22 are also electrically connected to their corresponding terminals 91.

When the second plug 40 is connected to the second socket 90, the third pad group 23 is electrically connected to the terminal group 91 via the second pad group 22 and the pins 43. Thereby, the USB drive 10 and the host device can communicate data with each other in compliance with USB3.1 Gen2 standard, for example. For example, the USB drive 10 and the host device can communicate data at super speed plus.

For example, the D− pad 22b and the D+ pad 22c of the second pad group 22 transmit a differential signal pair to the D− terminal 91b and the D+ terminal 91c of the second socket 90, and receive the differential signal pair from the D− terminal 91b and the D+ terminal 91c of the second socket 90.

The TX1− pad 22h, the TX1+ pad 22i, the TX2− pad 22t, and the TX2+ pad 22u of the second pad group 22 transmit two pairs of differential signals to the TX1− terminal 91h, the TX1+ terminal 91i, the TX2− terminal 91t, and the TX2+ terminal 91u of the second socket 90. The transmission rate of the TX1− pad 22h, the TX1+ pad 22i, the TX2− pad 22t, and the TX2+ pad 22u is higher than the transmission rate of the D− pad 22b and the D+ pad 22c.

The RX1− pad 22e, the RX1+ pad 22f, the RX2− pad 22o, and the RX2+ pad 22p of the second pad group 22 receive the two pairs of differential signals from the RX1− terminal 91e, the RX1+ terminal 91f, the RX2− terminal 91o, and the RX2+ terminal 91p of the second socket 90. The transmission rate of the RX1− pad 22e, the RX1+ pad 22f, the RX2− pad 22o, and the RX2+ pad 22p is higher than the transmission rate of the D− pad 22b and the D+ pad 22c.

In the USB drive 10 according to the second embodiment, the second pad group 22 includes the TX2− pad 22t and the TX2+ pad 22u connected to the fifth wiring pattern 101 that is electrically isolated from the first pad group 21. The second plug 40 is different from the first plug 15 in that it is connected to the TX2− pad 22t and the TX2+ pad 22u that are electrically isolated from the first pad group 21. That is, the substrate 12 according to the present embodiment can selectively have mounted thereon the first plug 15 and the second plug 40 that are different plugs, making it possible for the manufacturer of the USB drive 10 to easily adjust the manufacturing ratio between two types of USB drive 10, i.e., the USB drive 10 including the first plug 15 and the USB drive 10 including the second plug 40.

The TX2− pad 22t and the TX2+ pad 22u electrically isolated from the first pad group 21 transmit a signal to the second socket 90 at high speed together with the TX1− pad 22h and the TX1+ pad 22i. In case of mounting the first plug 15 on the substrate 12, the third pad group 23 can transmit a differential signal compliant with USB3.1 Gen1 standard, for example, to the first socket 50 via the D− pad 21b, the D+ pad 21c, the TX− pad 21h, and the TX+ pad 21i. On the other hand, in case of mounting the second plug 40 on the substrate 12, the third pad group 23 can transmit a differential signal compliant with USB3.1 Gen2 standard, for example, to the second socket 90 via the D− pad 22b, the D+ pad 22c, the TX1− pad 22h, the TX1+ pad 22i, the TX2− pad 22t, and the TX2+ pad 22u. Thus, the first plug 15 that can communicate in compliance with USB3.1 Gen1 standard and the second plug 40 that can communicate in compliance with USB3.1 Gen2 standard can be selectively mounted on the substrate 12 without change in the design of the substrate 12.

In the second embodiment, the first plug 15 is complied with USB3.0 Type-A standard or USB3.1 Type-A standard. However, the first plug 15 may be complied with USB2.0 Type-A standard, for example. In this case, four first pads 21 are provided on the substrate 12.

Third Embodiment

Figure 11:
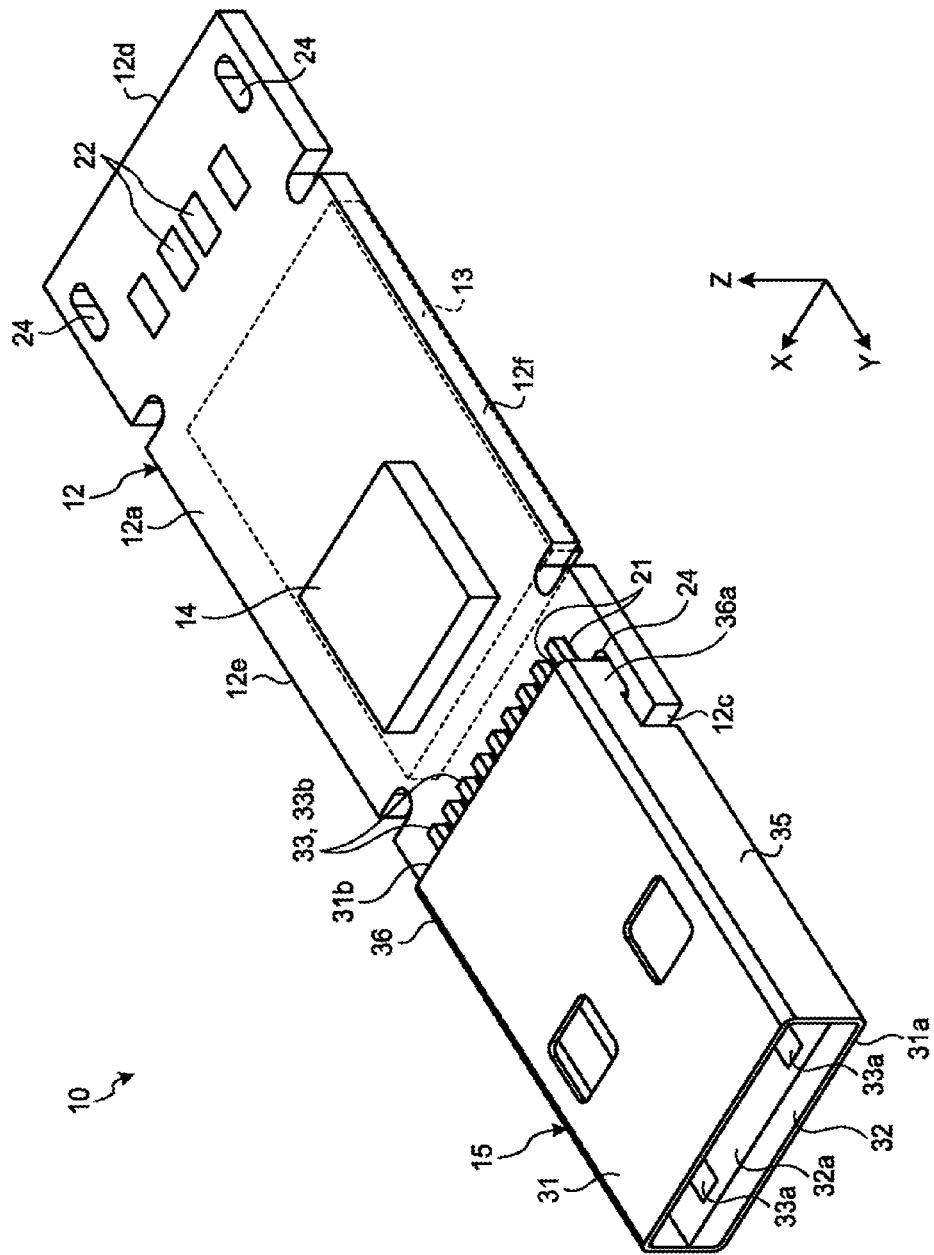
FIG. 11 is a perspective view of a USB drive according to a third embodiment.

A third embodiment will be described below with reference to FIG. 11. FIG. 11 is a perspective view of a USB drive 10 according to the third embodiment. FIG. 11 illustrates the USB drive 10 with a housing 11 omitted.

In the third embodiment, second pads 22 are mounted on a first face 12a of a substrate 12. The second pads 22 are closer to a rear end 12d than to a front end 12c. The second pads 22 are aligned along the short side of the substrate 12. Note that, the second pads 22 may be placed near the other edges 12c, 12e, or 12f. As described, in the third embodiment, first pads 21 and the second pads 22 are mounted on the same first face 12a.

FIG. 11 illustrates four second pads 22 on which a second plug 40 compliant with USB2.0 Type-A standard can be mounted as with the first embodiment. However, for example, twenty-two second pads 22 on which the second plug 40 compliant with USB Type-C standard can be mounted may be mounted on the first face 12a as with the second embodiment.

In the USB drive 10 according to the third embodiment, the first pads 21 and the second pads 22 are located on the first face 12a. Thereby, it is possible to provide the first pads 21 and the second pads 22 on the substrate 12, which is a single layer substrate, for example. Moreover, in case of mounting a flash memory 13 on the first face 12a, the components can be mounted on the single face of the substrate 12.

Fourth Embodiment

Figure 12:
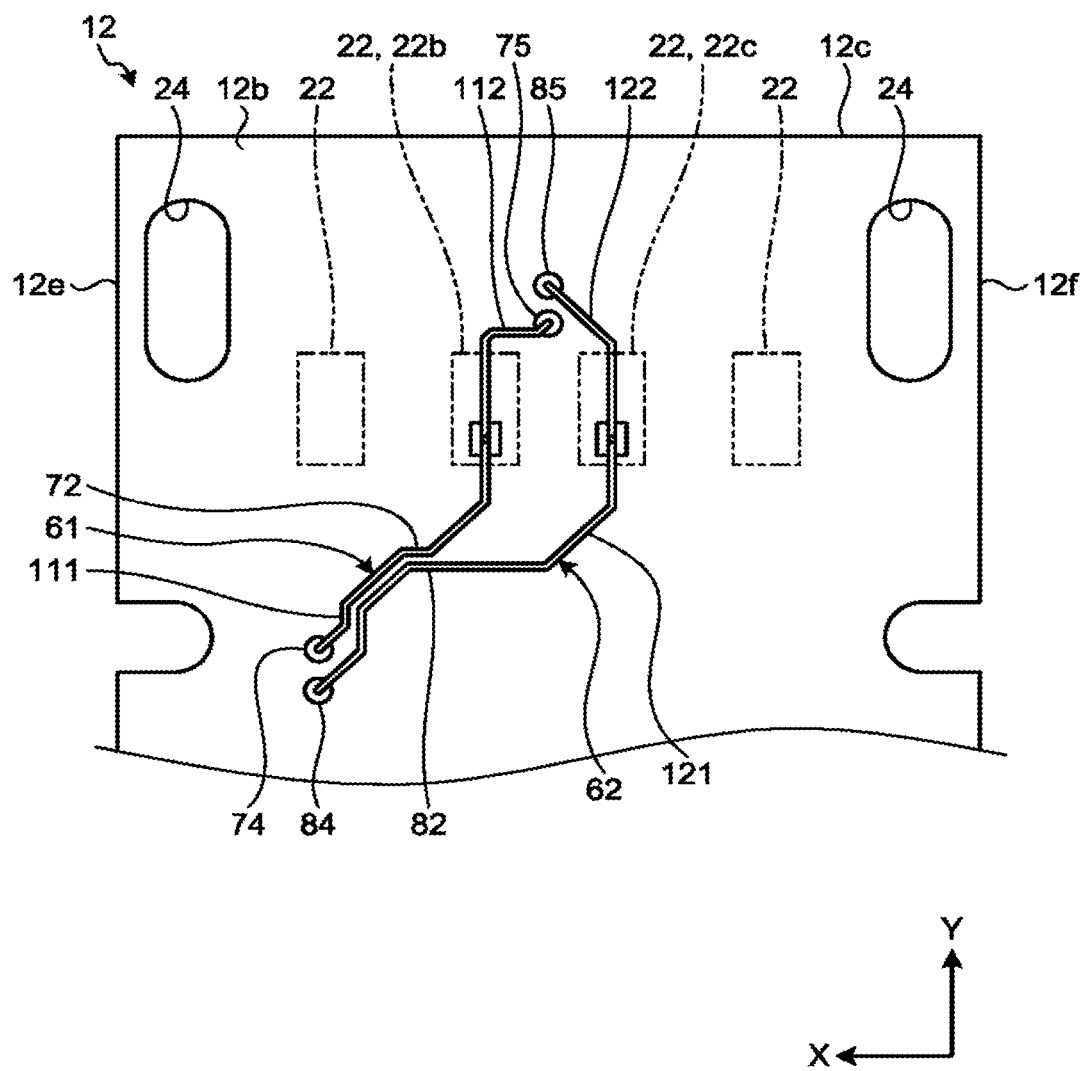
FIG. 12 is a schematic plan view of a second face of a substrate according to a fourth embodiment.

A fourth embodiment will be described below with reference to FIG. 12. FIG. 12 is a schematic plan view of a second face 12b of a substrate 12 according to the fourth embodiment. A first face 12a in the fourth embodiment is illustrated in FIG. 5.

As illustrated in FIG. 12, a first wiring pattern 61 includes a first intermediate part 111 and a second intermediate part 112 instead of the common part 77, the first branch 78, and the second branch 79. A second wiring pattern 62 includes a first intermediate part 121 and a second intermediate part 122 instead of the common part 87, the first branch 88, and the second branch 89. Each of the first intermediate parts 111 and 121 is an example of fourth part. Each of the second intermediate parts 112 and 122 is an example of fifth part.

The first intermediate part 111 includes a first extension 71, a first via 74, and a part of a second extension 72. The first intermediate part 111 connects a D− pad 23b of a third pad group 23 and a D− pad 22b of a second pad group 22. The D− pad 22b is an example of either of one of the first conductors and one of the second conductors.

The second intermediate part 112 includes a part of the second extension 72, a second via 75, and a third extension 73. The second intermediate part 112 connects the D− pad 22b of the second pad group 22 and a D− pad 21b of the first pad group 21. The D− pad 21b is an example of the other of one of the first conductors and one of the second conductors.

The first intermediate part 121 includes a first extension 81, a first via 84, and a part of a second extension 82. The first intermediate part 121 connects a D+ pad 23c of the third pad group 23 and a D+ pad 22c of the second pad group 22. The D+ pad 22c is an example of either one of the first conductors and one of the second conductors.

The second intermediate part 122 includes a part of the second extension 82, a second via 85, and a third extension 83. The second intermediate part 122 connects the D+ pad 22c of the second pad group 22 and a D+ pad 21c of the first pad group 21. The D+ pad 21c is an example of the other of one of the first conductors and one of the second conductors.

In the USB drive 10 according to the fourth embodiment, the first wiring pattern 61 includes the first intermediate part 111 that connects one of the third pad group 23 and one of the second pad group 22 and the second intermediate part 112 that connects one of the second pad group 22 and one of the first pad group 21. In other words, one of the third pads 23, one of the second pads 22, and one of the first pads 21 are serially connected. This makes it possible to reduce influence on the signal integrity in the first wiring pattern 61, for example.

Fifth Embodiment

Figure 13:
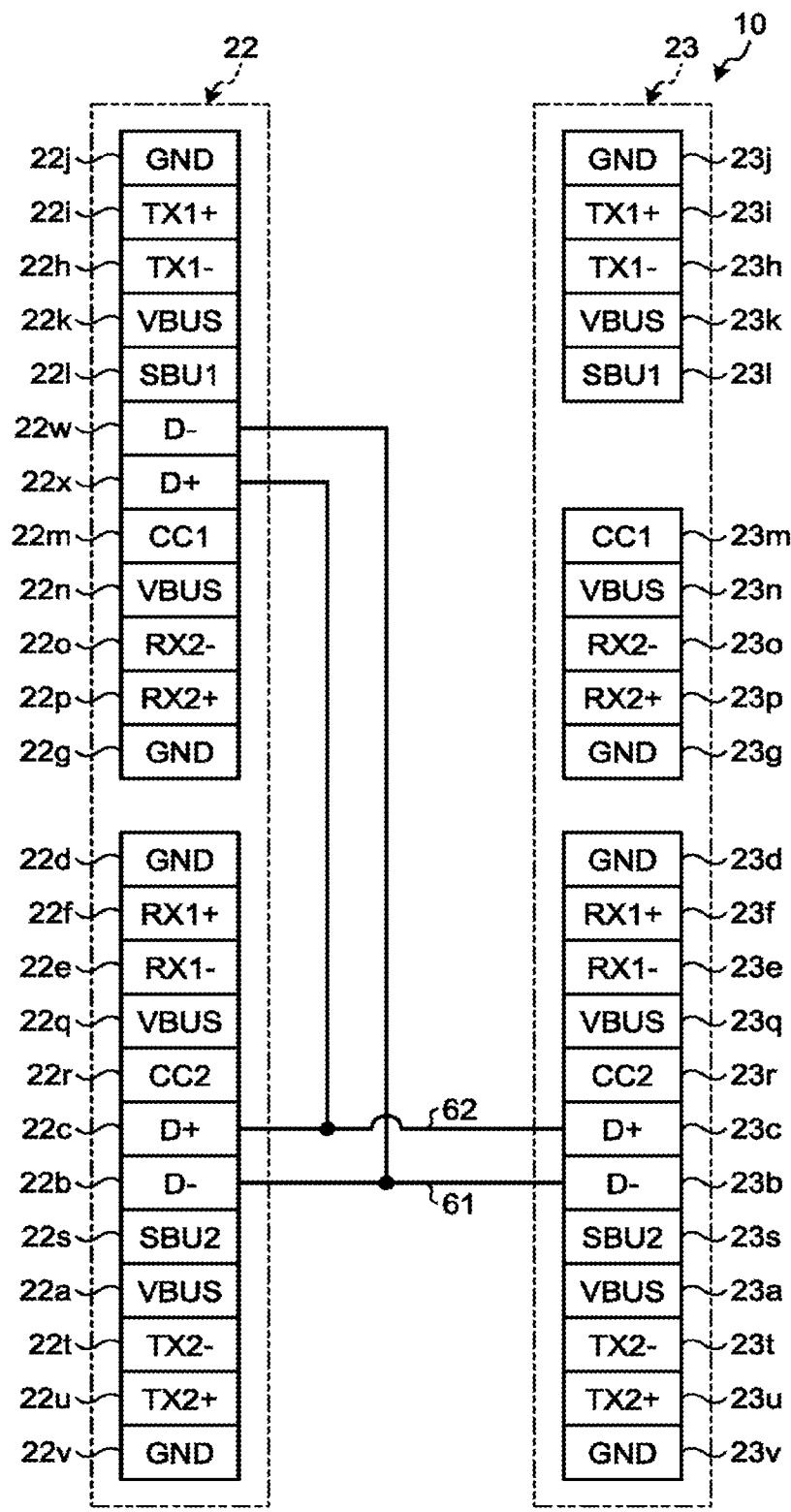
FIG. 13 schematically illustrates an example of connection among second pads and third pads according to a fifth embodiment.

A fifth embodiment will be described with reference to FIG. 13. FIG. 13 schematically illustrates an example of second pad group 22 and third pad group 23 according to the fifth embodiment.

In the fifth embodiment, a second plug 40 compliant with USB Type-C standard of FIG. 9 can be mounted on a substrate 12 instead of a first plug 15. The second plug 40 is an example of connector. The second plug 40 includes twenty-four pins 43.

The second plug 40 mounted on the substrate 12 can be connected to a second socket 90, for example. The second socket 90 is an example of external connector. In the fifth embodiment, the second socket 90 is a female connector compliant with USB Type-C standard.

As illustrated in FIG. 13, the second pad group 22 includes a D− pad 22b and a D+ pad 22c. Each of the D− pad 22b and the D+ pad 22c is an example of first conductor. In the fifth embodiment, the second pad group 22 further includes a negative differential signal (D−) pad 22w and a positive differential signal (D+) pad 22x. Each of the D− pad 22w and the D+ pad 22x is an example of second conductor.

A first wiring pattern 61 connects the D− pad 22b and the D− pad 22w of the second pad group 22 and a D− pad 23b of the third pad group 23. The third pads 23 are an example of third conductor. The first wiring pattern 61 is an example of first connecting wiring.

A second wiring pattern 62 connects the D+ pad 22c and the D+ pad 22x of the second pad group 22 and a D+ pad 23c of the third pad group 23. The second wiring pattern 62 is an example of second connecting wiring.

The second plug 40 can be connected to the second socket 90 in the first posture illustrated in FIG. 9. The second plug 40 is connected to the second socket 90 in the Y axis direction. Moreover, the second plug 40 can be connected to the second socket 90 in the second posture turned by 180° from the first posture in the Y axis direction (180° rotation around the Y axis).

When the second plug 40 is connected to the second socket 90 in the first posture, the D− pad 22b is electrically connected to a D− terminal 91b and the D+ pad 22c is electrically connected to a D+ terminal 91c via the pins 43. The D− pad 22b and the D+ pad 22c of the second pad group 22 transmit a differential signal pair to the D− terminal 91b and the D+ terminal 91c of the second socket 90, and receive the differential signal pair from the D− terminal 91b and the D+ terminal 91c of the second socket 90.

When the second plug 40 is connected to the second socket 90 in the second posture, the D− pad 22w is electrically connected to the D− terminal 91b and the D+ pad 22x is electrically connected to the D+ terminal 91c via the pins 43. The D− pad 22w and the D+ pad 22x of the second pad group 22 transmit a differential signal pair to the D− terminal 91b and the D+ terminal 91c of the second socket 90, and receive the differential signal pair from the D− terminal 91b and the D+ terminal 91c of the second socket 90.

In a USB drive 10 according to the fifth embodiment, the first wiring pattern 61 and the second wiring pattern 62 electrically connect the D− pad 22b and the D+ pad 22c that transmit and receive a differential signal pair to/from the second socket 90 connected to the second plug 40 in the first posture, the D− pad 22w and the D+ pad 22x that transmit and receive a differential signal pair to/from the second socket 90 connected to the second plug 40 in the second posture, and the third pad group 23 on which the controller 14 is mounted. Thereby, irrespective of the first posture or the second posture of the second plug 40 connected to the second socket 90, the D− pad 23b and the D+ pad 23c of the third pad group 23 are electrically connected to the second socket 90.

In the embodiments described above, the first plug 15, which is a male connector, is an example of first connector, and the second plug 40, which is a male connector, is an example of second connector. However, a female connector may be an example of first connector. A female connector may be an example of second connector.

Moreover, in the embodiments described above, the pins 33 of the first plug 15 are provided on the first pads 21, and the pins 43 of the second plug 40 are provided on the second pads 22. However, the first pads 21 may be terminals of the first plug 15. In this case, the first pads 21 serving as terminals are directly connected to the terminals 51 of the first socket 50. The second pads 22 may be terminals of the second plug 40. In this case, the second pads 22 serving as terminals are directly connected to the terminals 91 of the second socket 90.

According to at least one of the above embodiments, the first wiring connects one of the first conductors, one of the second conductors, and one of the third conductors. Thereby, the first connectors and the second connector are selectively mountable on the substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. An electronic device, comprising:
a substrate;
first conductors complied with a first USB standard on the substrate;
second conductors complied with a second USB standard on the substrate;

a connector connectable to an external connector, the connector mounted on the first conductors or the second conductors;

third conductors on the substrate;

an electronic component electrically connected to the third conductors; and a first wiring on the substrate, the first wiring connecting one of the first conductors, one of the second conductors, and one of the third conductors.

2. The electronic device according to claim 1, wherein the substrate includes a first face and a second face opposite to the first face, the first conductors are located on the first face, and the second conductors are located on the second face.

3. The electronic device according to claim 2, wherein the substrate has a substantially rectangular shape when seen from above and includes a first short side, a second short side, a first long side, and a second long side, the first conductors are arranged closer to the second short side than to the first short side in an extending direction of the second short side, and the second conductors are arranged closer to the second short side than to the first short side in the extending direction of the second short side.

4. The electronic device according to claim 3, wherein the first wiring includes a first part on the first face, a second part on the second face, and a third part, the first part connected to one of the first conductors, the third part connecting the first part and the second part, the third part is laid between the first conductors and the second short side along the long sides of the substrate, and the second part extends between adjacent ones of the second conductors.

5. The electronic device according to claim 1, wherein the substrate includes a first face and a second face opposite to the first face, the first conductors are located on the first face, and the second conductors are located on the first face.

6. The electronic device according to claim 1 further comprising a second wiring on the substrate, the second wiring connecting one of the first conductors and one of the third conductors and electrically isolated from the second conductors.

7. The electronic device according to claim 6, wherein the first USB standard is a standard that is capable of faster communication than the second USB standard.

8. The electronic device according to claim 7 further comprising a flash memory, wherein the substrate includes a first face and a second face opposite to the first face, the first conductors are located on the first face, the second conductors are located on the second face, the third conductors are located on the first face, the flash memory is mounted on the second face, and the electronic component is configured to control the flash memory.

9. The electronic device according to claim 8, wherein the substrate has a substantially rectangular shape when seen from above and includes a first short side, a second short side, a first long side, and a second long side, the first conductors are arranged closer to the second short side than to the first short side in an extending direction of the second short side, and the second conductors are arranged closer to the second short side than to the first short side in the extending direction of the second short side.

10. The electronic device according to claim 9, wherein the first wiring includes a first part on the first face, a second part on the second face, and a third part, the first part connected to one of the first conductors, the third part connecting the first part and the second part, the third part is laid between the first conductors and the second short side along the long sides of the substrate, and the second part extends between adjacent ones of the second conductors.

11. The electronic device according to claim 10, wherein the first wiring includes a common part connected to one of the third conductors, a first branch that connects the common part and one of the first conductors, and a second branch that connects the common part and one of the second conductors.

12. The electronic device according to claim 11, wherein the first branch is shorter in length than the common part, and the second branch is shorter in length than the common part.

13. The electronic device according to claim 9, wherein the first wiring includes a fourth part and a fifth part, the fourth part connects one of the third conductors and either of one of the first conductors and one of the second conductors, and the fifth part connects the either of one of the first conductors and one of the second conductors and the other of one of the first conductors and one of the second conductors.

14. The electronic device according to claim 7, wherein the electronic component is capable of communication complied with the first USB standard.

15. An electronic device, comprising:

a substrate on which a first connector or a second connector is mounted, the first connector connectable to a first external connector, the second connector connectable to a second external connector different from the first external connector;

first conductors on the substrate, the first conductors electrically connected to first external terminals incorporated in the first external connector when the first connector is connected to the first external connector;

second conductors on the substrate, the second conductors electrically connected to second external terminals incorporated in the second external connector when the second connector is connected to the second external connector;

third conductors on the substrate;

an electronic component mounted on the third conductors; and a first wiring on the substrate, the first wiring connecting one of the first conductors, one of the second conductors, and one of the third conductors.

16. The electronic device according to claim 15 further comprising a second wiring on the substrate, the second wiring connecting one of the first conductors and one of the third conductors and electrically isolated from the second conductors.

17. The electronic device according to claim 16, wherein when the first connector is connected to the first external connector, one of the first conductors connected to the first wiring is configured to transmit a signal to the first external connector, when the first connector is connected to the first external connector, one of the first conductors connected to the second wiring is configured to transmit a signal to the first external connector at a transmission rate higher than a transmission rate of the one of the first conductors connected to the first wiring, and when the second connector is connected to the second connector, one of the second conductors connected to the first wiring is configured to transmit a signal to the second external connector.

18. The electronic device according to claim 15, further comprising:

a second wiring on the substrate, the second wiring connecting one of the first conductors, one of the second conductors, and one of the third conductors, and a third wiring on the substrate, the third wiring connecting one of the second conductors and one of the third conductors and electrically isolated from the first conductors.

19. The electronic device according to claim 18, wherein when the first connector is connected to the first external connector, one of the first conductors connected to the first wiring is configured to transmit a signal to the first external connector, when the first connector is connected to the first external connector, one of the first conductors connected to the second wiring is configured to transmit a signal to the first external connector at a transmission rate higher than a transmission rate of the one of the first conductors connected to the first wiring, when the second connector is connected to the external second connector, one of the second conductors connected to the first wiring is configured to transmit a signal to the second external connector, when the second connector is connected to the second external connector, one of the second conductors connected to the second wiring is configured to transmit a signal to the second external connector at a transmission rate higher than a transmission rate of the one of the second conductors connected to the first wiring, and when the second connector is connected to the second external connector, one of the second conductors connected to the third wiring is configured to transmit a signal to the second external connector at a transmission rate higher than a transmission rate of the one of the second conductors connected to the first wiring.

20. An electronic device, comprising:

a connector connectable to an external connector complied with USB Type-C standard;

a substrate on which the connector is mounted;

two first conductors on the substrate, the first conductors configured to transmit and receive a differential signal pair to and from the external connector when the external connector is connected to the connector in a first posture;

two second conductors on the substrate, the second conductors configured to transmit and receive a differential signal pair to and from the external connector when the external connector is connected to the connector in a second posture, the second posture being turned by 180° from the first posture in a direction where the external connector is connected to the connector;

third conductors on the substrate;

an electronic component mounted on the third conductors;

a first connecting wiring on the substrate, the first connecting wiring connecting one of the two first conductors, one of the two second conductors, and one of the third conductors; and a second connecting wiring on the substrate, the second connecting wiring connecting the other of the two first conductors, the other of the two second conductors, and one of the third conductors.

* * * * *